United States Patent
Takayama

(10) Patent No.: US 9,184,565 B2
(45) Date of Patent: Nov. 10, 2015

(54) SEMICONDUCTOR LIGHT-EMITTING ELEMENT

(71) Applicant: Panasonic Intellectual Property Management Co., Ltd., Osaka (JP)

(72) Inventor: Toru Takayama, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/535,057

(22) Filed: Nov. 6, 2014

(65) Prior Publication Data

US 2015/0063392 A1 Mar. 5, 2015

Related U.S. Application Data

(63) Continuation of application No. PCT/JP2013/001615, filed on Mar. 12, 2013.

(30) Foreign Application Priority Data

May 16, 2012 (JP) .................. 2012-112160

(51) Int. Cl.
*H01S 5/22* (2006.01)
*H01S 5/028* (2006.01)
(Continued)

(52) U.S. Cl.
CPC .............. *H01S 5/2205* (2013.01); *B82Y 20/00* (2013.01); *H01S 5/0287* (2013.01); *H01S 5/22* (2013.01);
(Continued)

(58) Field of Classification Search
CPC .. H01S 5/1014; H01S 5/1064; H01S 5/32341
See application file for complete search history.

(56) References Cited

U.S. PATENT DOCUMENTS 6,317,445 B1 11/2001 Coleman et al.
6,798,798 B2 * 9/2004 Yoshida et al. .......... 372/29.021
(Continued)

FOREIGN PATENT DOCUMENTS

EP 1241751 A1 9/2002
JP 05-067845 A 3/1993
(Continued)

OTHER PUBLICATIONS

Silfvast, William, "Fundamentals of Photonics: Lasers," May 19, 2003, SPIE, https://spie.org/Documents/.../00%20STEP%20Module%2005.pdf.*

(Continued)

*Primary Examiner* — Joshua King
(74) *Attorney, Agent, or Firm* — McDermott Will & Emery LLP

(57) ABSTRACT

In a semiconductor light-emitting element, a first cladding layer in a first conductive type, a quantum well active layer, and a second cladding layer in a second conductive type are stacked on a semiconductor substrate in this order. A ridge-shaped stripe formed at the second cladding layer forms a waveguide. Rf<Rr and Wf>Wr are satisfied, where the width of the ridge-shaped stripe at a front end face from which laser light is output is represented by Wf, the width of the ridge-shaped stripe at a rear end face is represented by Wr, the reflectance of the front end face is represented by Rf, and the reflectance of the rear end face is represented by Rr. Light in a fundamental transverse mode, a first high-order transverse mode, a second high-order transverse mode, and a third high-order transverse mode is guided in the waveguide.

21 Claims, 27 Drawing Sheets

(51) Int. Cl.
*H01S 5/343* (2006.01)
*B82Y 20/00* (2011.01)
*H01S 5/00* (2006.01)
*H01S 5/10* (2006.01)
*H01S 5/20* (2006.01)
*H01S 5/32* (2006.01)

(52) U.S. Cl.
CPC ........... *H01S 5/34333* (2013.01); *H01S 5/0014* (2013.01); *H01S 5/1014* (2013.01); *H01S 5/2009* (2013.01); *H01S 5/3211* (2013.01); *H01S 2301/16* (2013.01)

(56) References Cited

U.S. PATENT DOCUMENTS

2004/0233957 A1  11/2004  Ito et al.
2007/0165685 A1*  7/2007  Mizuuchi et al. .......... 372/38.05
2009/0034573 A1*  2/2009  Takayama et al. ......... 372/49.01
2012/0002271 A1*  1/2012  Kuramoto et al. ............ 359/344

FOREIGN PATENT DOCUMENTS

| JP | 2001-358405 A | 12/2001 |
| JP | 2002-280668 A | 9/2002 |
| JP | 2005-012178 A | 1/2005 |
| JP | 2011-151238 A | 8/2011 |

OTHER PUBLICATIONS

International Search Report issued in International Application No. PCT/JP2013/001615 dated May 7, 2013, with partial English translation.

* cited by examiner

REAR END FACE
REFLECTANCE Rr

FRONT END FACE
REFLECTANCE Rf

θ 0.5°, W_f 15 μm, W_r 1 μm

θ 0.19°, W_f 10.6 μm, W_r 5.4 μm

θ 0.36°, W_f 13 μm, W_r 3 μm

θ 0.10°, W_f 9.4 μm, W_r 6.6 μm

θ 0.27°, W_f 11.8 μm, W_r 4.2 μm

θ 0.0°, W_f 8.0 μm, W_r 8.0 μm

OPERATING CURRENT VALUE

POWER CONVERSION EFFICIENCY

OPERATING VOLTAGE

REAR END FACE
REFLECTANCE Rr

FRONT END FACE
REFLECTANCE Rf

AVERAGE RIDGE-SHAPED STRIPE WIDTH 6 μm、
□RESONATOR LENGTH 1000 μm、●RESONATOR LENGTH 550 μm

AVERAGE RIDGE-SHAPED STRIPE WIDTH 9 μm、
□RESONATOR LENGTH 1000 μm、●RESONATOR LENGTH 550 μm

AVERAGE RIDGE-SHAPED STRIPE WIDTH 12 μm、
□RESONATOR LENGTH 1000 μm、●RESONATOR LENGTH 550 μm

ΔW=0 μm

ΔW=1 μm

ΔW=2 μm

ΔW=3 μm

ΔW=0 μm

ΔW=1 μm

ΔW=2 μm

ΔW=3 μm

OPERATION AT 25°C

OPERATION AT 60°C

AVERAGE RIDGE-SHAPED STRIPE WIDTH 10 μm、
△RESONATOR LENGTH 1300 μm、◆RESONATOR LENGTH 800 μm

AVERAGE RIDGE-SHAPED STRIPE WIDTH 20 μm、
△RESONATOR LENGTH 1300 μm、◆RESONATOR LENGTH 800 μm

AVERAGE RIDGE-SHAPED STRIPE WIDTH 30 μm、
△RESONATOR LENGTH 1300 μm、◆RESONATOR LENGTH 800 μm

OPERATION AT 25°C

OPERATION AT 60°C

REAR END FACE
REFLECTANCE Rr

FRONT END FACE
REFLECTANCE Rf

REAR END FACE
REFLECTANCE Rr

FRONT END FACE
REFLECTANCE Rf

REAR END FACE
REFLECTANCE Rr

FRONT END FACE
REFLECTANCE Rf

SEMICONDUCTOR LIGHT-EMITTING ELEMENT

CROSS-REFERENCE TO RELATED APPLICATIONS

This is a continuation of International Application No. PCT/JP2013/001615 filed on Mar. 12, 2013, which claims priority to Japanese Patent Application No. 2012-112160 filed on May 16, 2012. The entire disclosures of these applications are incorporated by reference herein.

BACKGROUND

Conventionally, projection type image display devices such as projectors have been broadly used as one type of devices for efficiently acquiring a large-screen image. The projection type image display device is configured such that a compact spatial light modulation element, such as a liquid crystal panel, for forming an image corresponding to a video signal is irradiated with light emitted from a light source such as a lamp and that the optical image is enlarged and projected on a screen by using a projection lens. In the projection type image display device such as a projector, an extra high pressure mercury lamp having a high light emitting efficiency in a band of wavelength of visible light are typically used as the light source.

In recent years, not extra high pressure mercury lamps but LEDs which are semiconductor elements have been increasingly used as light sources of projectors. The LED projectors have characteristics such as low power consumption, little noise, and a longer lamp life, and the size thereof is small.

However, since the LEDs use spontaneously-emitted light from active layers which are light-emitting layers, the brightness of such light is not sufficient. Thus, attention has been placed on laser projectors each using a watt-class high-power semiconductor laser as a light source and being capable of exciting phosphors by the semiconductor laser to provide sufficient brightness of light in a visible range.

At present, semiconductor lasers using a nitride-based material are capable of emitting light such as visible light and ultraviolet light, and are demanded as semiconductor light-emitting elements suitable as light sources.

For example, if a nitride-based semiconductor laser is used as a light source for blue and green light, and a laser using an AlGaInP-based material is used as a light source for red light, a compact low-power laser projector can be provided.

Not only watt-class high-power operation but also operation for a long period of time of equal to or longer than 10000 hours under a high temperature of equal to or higher than 50° C. have been demanded for semiconductor lasers used as projector light sources.

In order to obtain high-power output from a semiconductor laser, occurrence of catastrophic optical damage (COD) that a resonator end face is melted and damaged by light output therefrom should be reduced. In order to reduce occurrence of COD, it is effective that a front resonator end face from which laser light is extracted is coated with a dielectric film having a low reflectance (AR) of equal to or lower than about 10% and that a rear resonator end face is coated with a dielectric film having a high reflectance (HR) of equal to or higher than about 90%. According to such a configuration, a light extraction efficiency from a front end side can be improved, a slope efficiency (the rate of light output increase to current injection) in association with current-versus-light-output characteristics can be improved, and an operating current value can be decreased to reduce heat generation of the semiconductor laser. Further, even if the semiconductor laser outputs laser light at a certain level, a light density is lower on the front end side in the resonator. As a result, the light output level can be increased without occurrence of COD.

Typically, in the case of semiconductor lasers using an AlGaInP-based material or an AlGaAs-based material, the semiconductor lasers having an end-face window structure have been broadly used in order to ensure the long-term operation of the high-power semiconductor laser requiring operation with a power of equal to or higher than several hundreds megawatts. In this structure, quantum-well disordering occurs by impurities diffused in part of a quantum well active layer in the vicinity of a resonator end face, thereby increasing bandgap energy. Accordingly, the region of the active layer in the vicinity of the resonator end face substantially becomes transparent to laser light. As a result, a decrease in bandgap energy due to heat generation caused by light absorption at the resonator end face can be reduced. This reduces light absorption at the resonator end face, and occurrence of COD can be reduced.

On the other hand, in the case of lasers using a nitride-based material, it is difficult to cause quantum-well disordering by impurity diffusion because of the characteristics of an InGaAlN-based material used for a quantum well active layer. For such a reason, an end-face window structure has not been currently used for such lasers.

At present, in order to reduce a light density at an end face in a ridge-shaped waveguide structure of a watt-class nitride-based semiconductor laser, the following waveguide structure is employed: the semiconductor laser has a wide ridge-shaped stripe with a width of at least about 8 to 15 μm; and an AR coating is formed on a front end face, and an HR coating is formed on a rear end face. This greatly expands the distribution of light in the waveguide in the horizontal direction. Accordingly, the light density at the resonator end face decreases, and the light output level without COD can be improved.

Note that, in the present specification, the direction perpendicular to a resonator direction and parallel to an active layer is referred to as a "horizontal direction," and the direction perpendicular to the resonator direction and parallel to a normal direction of the active layer is referred to as a "vertical direction."

Typically, in high-power semiconductor lasers having a straight stripe structure in which a ridge-shaped stripe width is maintained constant in a resonator direction, if the difference between reflectance Rf on a laser light emission end (AR) side and reflectance Rr on a rear end (HR) side is significantly large, non-uniform light distribution in which the field intensity of light in the direction of a resonator of the laser, i.e., the resonator direction, is higher on the laser light emission end face (AR) side and is lower on the rear end face (HR) side is exhibited. In this case, more carriers injected into an active layer are consumed in the vicinity of the laser light emission end face (AR), whereas few carriers injected into the active layer are consumed in the vicinity of the rear end face (HR). On the other hand, since current is injected such that the density thereof is maintained constant in the resonator direction, non-uniform carrier concentration distribution called "spatial hole burning (SHB)" occurs in the resonator direction. Due to the influence of SHB, sufficient gain cannot be obtained. As just described, in the conventional high-power laser having the straight stripe structure, if the reflectance at the light emission end face is excessively decreased to provide a high slope efficiency, and such an excessive decrease extremely increases the difference in reflectance between the light emission end face and the rear end face, the field intensity becomes non-uniform. As a result, the gain is decreased, and the slope efficiency is lowered. This leads to limitations on light output, and it is difficult to obtain a light output of equal to or greater than one watt.

For the foregoing reasons, in a conventional laser described in Japanese Unexamined Patent Publication No. 2001-358405 (hereinafter referred to as "Patent Document 1"), a tapered stripe structure in which the width of a waveguide gradually increases in a resonator direction as illustrated in FIG. 32 is used to reduce significant the non-uniform field intensity distribution of light in the resonator direction, thereby reducing occurrence of SHB.

In this case, even if reflectance at a light emission end face is lowered for the purpose of improving a slope efficiency, and the difference in reflectance between the light emission end face and a rear end face extremely increases accordingly, saturation of gain due to occurrence of SHB in the resonator direction can be reduced.

Thus, even if reflectance at a light emission end face is set at equal to or lower than 0.1% to provide a high slope efficiency, and a mirror loss increases accordingly, there is no saturation of gain caused due to SHB, and a high slope efficiency can be provided.

Moreover, since the field intensity of light is not concentrated at the light emission end face of a resonator, occurrence of COD at the light emission end face can be reduced.

The tapered stripe structure is used not only for reducing occurrence of SHB, but also for changing the shape of the distribution of guided light propagating in the waveguide and for cutting off laser light in high-order transverse modes and amplifying and outputting only laser light in a fundamental transverse mode. In addition to the stripe structure described in Patent Document 1, stripe structures described in Japanese Unexamined Patent Publication No. H05-067845, Japanese Unexamined Patent Publication No. 2002-280668, Japanese Unexamined Patent Publication No. 2005-012178, and U.S. Pat. No. 6,317,445 have been reported.

SUMMARY

As described above, since it is difficult to employ an end-face window structure for a nitride-based semiconductor laser, it is effective for reduction in degradation of the semiconductor laser due to COD during operation that the stripe width of a waveguide on a front end side from which light is extracted is increased to lower the density of light at the end face.

In a watt-class high-power laser, an operating current value is large, and extremely-great self-heating of the laser during operation occurs. It is important for reduction in self-heating of a laser to reduce power consumption (=Operating Current Value×Operating Voltage) of the laser. Reduction in power consumption is equivalent to increase in power conversion efficiency (=Output Light Power/Power Consumption), and not only the operating current value but also the operating voltage should be reduced.

If a stripe width is merely increased to reduce occurrence of COD, the area of a waveguide increases. This reduces the series resistance of the laser, as well as decreasing the operating voltage. However, the operating current value increases, resulting in lowering of the power conversion efficiency. In order to reduce occurrence of COD and decrease the operating current value, it is effective that a tapered stripe structure is, by narrowing the stripe width on a rear end side, formed to reduce an increase in area of the waveguide stripe.

However, even if the tapered stripe structure can reduce occurrence of SHB, i.e., variation in carrier concentration, in a resonator direction in an active layer, SHB occurs in the horizontal direction in the active layer due to a larger stripe width on a front end side.

In the watt-class high-power laser, the operating current value is large, and light output for operation is also extremely high. Thus, occurrence of SHB results in lowering of a slope efficiency and temperature characteristics. In the watt-class laser whose heat generation amount during operation is large, the operating current value increases, due to lowering of the temperature characteristics, at an accelerated pace with increasing a temperature.

Lowering of the slope efficiency and the temperature characteristics of the watt-class high-power laser directly leads not only to reduction in light output in high-temperature operation but also to degradation of the laser. This has a significant adverse effect on a practical use.

In view of the foregoing, the technique of the present disclosure provides a watt-class semiconductor light-emitting element exhibiting excellent temperature characteristics and long-term reliability and having a high power conversion efficiency.

The semiconductor light-emitting element of the present disclosure includes a first cladding layer in a first conductive type, a multiple quantum well active layer, and a second cladding layer in a second conductive type which are stacked on a semiconductor substrate in this order. A ridge-shaped stripe formed at the second cladding layer forms a waveguide. $Rf<Rr$ and $Wf>Wr$ are satisfied, where the width of the ridge-shaped stripe at a front end face from which laser light is emitted is represented by $Wf$, the width of the ridge-shaped stripe at a rear end face opposite to the front end face is represented by $Wr$, the reflectance of the front end face is represented by $Rf$, and the reflectance of the rear end face is represented by $Rr$. Light in a fundamental transverse mode, a first high-order transverse mode, a second high-order transverse mode, and a third high-order transverse mode is guided in the waveguide.

According to the foregoing configuration, at least light in the high-order transverse modes up to the third order transverse mode can be guided. Thus, even if current-versus-light-output characteristics have kinks, the change in slope efficiency at the points at which the kinks occur is reduced. Consequently, an increase in operating current value in high-temperature operation and degradation of the semiconductor light-emitting element in watt-class operation can be reduced. If the ridge-shaped stripe width at the rear end face is increased to such a width that at least light in the high-order transverse modes up to the third order transverse mode can be guided, the area of a region into which current is injected increases, and the series resistance of the semiconductor light-emitting element is reduced. Thus, an operating voltage can be decreased. As a result, the current-versus-light-output characteristics exhibiting excellent linearity and lower operating current characteristics can be provided even in high-temperature operation.

Note that the width of a current injection region at the front end face may be less than the width $Wf$ of the ridge-shaped stripe at the front end face.

According to the foregoing configuration, occurrence of SHB in the horizontal direction is reduced. As a result, occurrence of saturation of gain and current leakage can be further reduced, and the operating current value can be decreased. Thus, temperature characteristics are further improved.

The semiconductor light-emitting element may further include a contact layer formed on the second cladding layer.

The width Wc of the contact layer at the front end face may be less than the width Wf of the ridge-shaped stripe at the front end face.

According to the foregoing configuration, the amount of current injected into both end parts of the ridge-shaped stripe in the horizontal direction is reduced in the front end part of the active layer, and occurrence of SHB in the horizontal direction is more significantly reduced. As a result, occurrence of saturation of gain and current leakage can be further reduced, and the operating current value can be decreased. Thus, temperature characteristics are further improved.

The semiconductor light-emitting element may further include a current block layer formed on the second cladding layer such that an opening is formed. The width of the opening of the current block layer at the front end face may be less than the width Wf of the ridge-shaped stripe at the front end face.

According to the foregoing configuration, the amount of current injected into both end parts of the ridge-shaped stripe in the horizontal direction is reduced in the front end part of the active layer, and occurrence of SHB in the horizontal direction is more significantly reduced. As a result, occurrence of saturation of gain and current leakage can be further reduced, and the operating current value can be decreased. Thus, temperature characteristics are further improved.

Note that a center part of the ridge-shaped stripe in the horizontal direction may protrude upward.

According to the foregoing configuration, the amount of current injected into both end parts of the ridge-shaped stripe in the horizontal direction is reduced in the front end part of the active layer, and occurrence of SHB in the horizontal direction is more significantly reduced. As a result, occurrence of saturation of gain and current leakage can be further reduced, and the operating current value can be decreased. Thus, temperature characteristics are further improved.

The resistance of both end parts of the ridge-shaped stripe in the horizontal direction may be, at the front end face, increased by ion implantation.

According to the foregoing configuration, the amount of current injected into both end parts of the ridge-shaped stripe in the horizontal direction is reduced in the front end part of the active layer, and occurrence of SHB in the horizontal direction is more significantly reduced. As a result, occurrence of saturation of gain and current leakage can be further reduced, and the operating current value can be decreased. Thus, temperature characteristics are further improved.

The angle $\theta$ may satisfy $\tan(\theta)=\Delta W_1/(2L)$, where the length of a region of the waveguide in which a ridge-shaped stripe width changes in a resonator direction is represented by L and the absolute value of the difference between the ridge-shaped stripe width at a width change start point and the ridge-shaped stripe width at a width change end point is represented by $\Delta W_1$. The angle $\theta$ may fall within a range of equal to or higher than 0.05° and equal to or lower than 0.15°.

According to the foregoing configuration, occurrence of SHB in the resonator direction is more significantly reduced. As a result, occurrence of saturation of gain and current leakage can be further reduced, and the operating current value can be decreased. Thus, temperature characteristics are further improved.

A resonator length may fall within a range of equal to or longer than 800 μm and equal to or shorter than 1300 μm. The width Wf of the ridge-shaped stripe at the front end face may fall within a range of equal to or greater than 10 μm and equal to or less than 30 μm. The total thickness of well layers of the multiple quantum well active layer may fall within a range of equal to or greater than 4 nm and equal to or less than 10 nm.

According to the foregoing configuration, even if the total thickness of the well layers is small, an increase in current leakage can be reduced or prevented. An increase in lasing carrier concentration threshold and operating current value can be reduced or prevented even in high-temperature operation. As a result, low operating current characteristics can be provided even in high-temperature operation, and a high power conversion efficiency can be provided.

Moreover, $0.1 \leq xw \leq 0.15$ may be satisfied, where the atomic composition of each well layer of the multiple quantum well active layer is $In_{xw}Ga_{yw}Al_{1-xw-yw}N$. The thickness of each well layer of the multiple quantum well active layer may fall within a range of equal to or greater than 2 nm and equal to or less than 5 nm.

According to the foregoing configuration, occurrence of compositional separation causing non-uniformity in the distribution of the atomic composition of the well layer and occurrence of lattice defects can be reduced. Moreover, an increase in lasing carrier concentration threshold and operating current value can be reduced or prevented. As a result, the semiconductor light-emitting element having a high power conversion efficiency and capable of outputting light having a wavelength of 445 nm band can be provided.

A resonator length may fall within a range of equal to or longer than 550 μm and equal to or shorter than 1000 μm. The width Wf of the ridge-shaped stripe at the front end face may fall within a range of equal to or greater than 6 μm and equal to or less than 12 μm. The total thickness of well layers of the multiple quantum well active layer may fall within a range of equal to or greater than 9 nm and equal to or less than 20 nm.

According to the foregoing configuration, even if the total thickness of the well layers is small, an increase in current leakage can be reduced or prevented. An increase in lasing carrier concentration threshold and operating current value can be reduced or prevented even in high-temperature operation. As a result, low operating current characteristics can be provided even in high-temperature operation, and a high power conversion efficiency can be provided.

Moreover, $0 \leq xw \leq 0.1$ may be satisfied, where the atomic composition of each well layer of the multiple quantum well active layer is $In_{xw}Ga_{yw}Al_{1-xw-yw}N$. The thickness of each well layer of the multiple quantum well active layer may fall within a range of equal to or greater than 3 nm and equal to or less than 8 nm.

According to the foregoing configuration, occurrence of compositional separation causing non-uniformity in the distribution of the atomic composition of the well layer and occurrence of lattice defects can be reduced. Moreover, an increase in lasing carrier concentration threshold and operating current value can be reduced or prevented. As a result, the semiconductor light-emitting element having a high power conversion efficiency and capable of outputting light having a wavelength of 405 nm band can be provided.

The technique of the present disclosure can provide a watt-class high-power laser exhibiting excellent temperature characteristics and long-term reliability and having a high power conversion efficiency.

DETAILED DESCRIPTION

Embodiments of the present disclosure will be described below with reference to drawings.

First Embodiment

Figure 2:
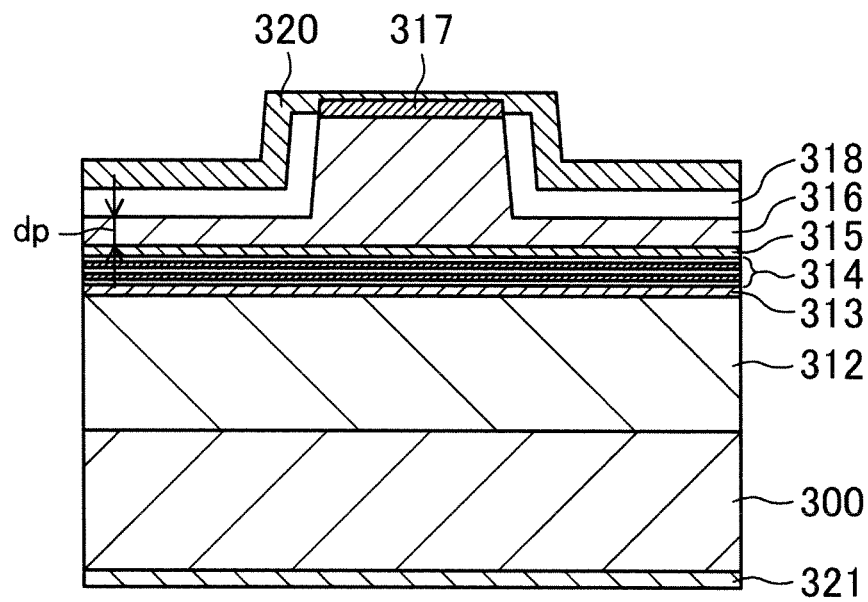
FIG. 2 is a cross-sectional view of a semiconductor light-emitting element of a first embodiment of the present disclosure.

A cross-sectional structure of a semiconductor light-emitting element of a first embodiment of the present disclosure is illustrated in FIG. 2. FIG. 2 is a cross-sectional view of a semiconductor laser configured such that an n-type AlGaN cladding layer 312 (a film thickness of 2.5 µm), an n-type AlGaN guide layer 313 (860 Å (86 nm)), a multiple quantum well active layer 314 made of an InGaN-based material, a p-type quantum well electronic barrier layer 315, a p-type AlGaN cladding layer 316, a p-type GaN contact layer 317 (a film thickness of 0.1 µm), a current block layer 318 transparent to light, a p-type electrode 320, and an n-type electrode 321 are stacked on a GaN substrate 300. A ridge-shaped stripe forms a waveguide at the p-type AlGaN cladding layer 316, and an average ridge-shaped stripe width (W) is 8.0 µm. Note that the order of stacking the n-type and p-type layers is not limited to the foregoing, and the positions of the n-type and p-type layers may be switched.

In this state, the distance between an upper end part of the ridge of the p-type AlGaN cladding layer 316 and the active layer 314 is 0.5 µm, and the distance between a lower end part of the ridge of the p-type AlGaN cladding layer 316 and the active layer 314 is indicated by "dp" (0.2 µm).

In the first embodiment, an Al composition in the n-type AlGaN cladding layer 312 and the p-type AlGaN cladding layer 316 is 0.05 in order to confine light in the vertical direction in the active layer.

An increase in Al composition in the n-type AlGaN cladding layer 312 and the p-type AlGaN cladding layer 316 results in a greater refractive index difference between the active layer and the cladding layer. Thus, it can ensured that light is confined in the vertical direction in the active layer, and therefore a lasing threshold current can be decreased. However, due to the difference in thermal expansion coefficient between the AlGaN layer and the GaN substrate, an extremely-great Al composition in the AlGaN cladding layer leads to lattice defects, resulting in lowering of reliability. For such a reason, the semiconductor light-emitting element is preferably formed such that the Al composition in the AlGaN cladding layer is equal to or less than 0.2.

In order to output laser light having a wavelength of 405 nm band, the multiple quantum well active layer 314 of the first embodiment has a double quantum well (DQW) structure of two InGaN well layers each having a thickness of 75 Å (7.5 nm) and having an In composition of 0.05.

In order to output laser light having a wavelength of 405 nm band, it is preferable that an atomic composition xw of In satisfies $0 \leq xw \leq 0.1$, where an atomic composition in the well layer of the quantum well active layer is $In_{xw}Ga_{yw}Al_{1-xw-yw}N$, and that the thickness of each well layer is equal to or greater than 30 Å (3 nm) and equal to or less than 80 Å (8 nm). When the thickness of each well layer exceeds 80 Å (8 nm) beyond the foregoing atomic composition range, strain energy stored inside the well layer increases, and therefore the atomic composition in the well layer becomes non-uniform. As a result, a light-emitting efficiency is lowered. Reasons for the foregoing will be described below.

Suppose that a nitride mixed crystal semiconductor is made of InN, AlN, and GaN. The lattice mismatch between InN and GaN, the lattice mismatch between InN and AlN, and the lattice mismatch between GaN and AlN are 11.3%, 13.9%, and 2.3%, respectively. In this case, the distance between atoms is different among InN, GaN, and AlN. Thus, even if an atomic composition is set such that, e.g., the lattice constant of the InGaAlN layer is equal to that of GaN, the distance between atoms forming the InGaAlN layer and the bond angle between the atoms forming the InGaAlN layer are different from an ideal distance and an ideal bond angle in the case of a binary compound semiconductor. Thus, strain energy is stored inside the InGaAlN layer. In order to reduce such internal strain energy, phase separation occurs, which is the state in which there are regions different in atomic composition from each other in the InGaAlN layer.

In this case, In atoms, Ga atoms, and Al atoms are non-uniformly distributed across the InGaAlN layer. Thus, bandgap energy distribution and refractive index distribution in the layer where phase separation occurs become non-uniform. The non-uniform composition region where phase separation occurs mainly acts to absorb light, or causes scattering of guided light. When phase separation occurs, the operating current of the semiconductor laser increases, resulting in a shorter life of the semiconductor laser.

The difference in lattice constant between GaN and AlN is small, and the difference in lattice constant between InN and GaN and the difference in lattice constant between InN and AlN are large. Thus, strain energy inside the InGaAlN layer is most susceptible to the atomic composition xw of In. When the In composition xw in the InGaAlN well layer is 0.1, if the thickness of each well layer exceeds 80 Å (8 nm), strain energy stored inside the well layer increases, resulting in phase separation and lattice defects. Accordingly, the light-emitting efficiency of the semiconductor light-emitting element is lowered.

Thus, in order to output laser light having a wavelength of 405 nm band, it is preferable that the atomic composition xw of In satisfies $0 \leq xw^- 0.1$ and that the thickness of each well layer is equal to or less than 80 Å (8 nm), considering bandgap energy of the $In_{xw}Ga_{yw}Al_{1-xw-yw}N$ well layer.

In addition, since an extremely-small thickness of the well layer results in a greater carrier concentration in the well layer, current leakage increases, and therefore temperature characteristics are degraded. For such a reason, the thickness of each well layer is preferably at least 30 Å (3 nm) or more.

When a thin well layer is used, strain energy stored inside the well layer decreases. This can reduce occurrence of phase separation and lattice defects, but current leakage increases as described above. Thus, when a plurality of thin well layers are used, a carrier concentration decreases, and therefore occurrence of current leakage can be reduced.

However, if the total thickness of the well layers of a multiple quantum well active layer is too large, strain energy stored inside the entirety of the multiple quantum well active layer increases, resulting in lattice defects. For such a reason, in order to reduce occurrence of lattice defects and phase separation and to reduce current leakage, the total thickness of the well layers is preferably equal to or greater than 90 Å (9 nm) and equal to or less than 200 Å (20 nm).

The InGaAlN well layer formed such that the In composition and thickness thereof fall within the foregoing ranges can provide a semiconductor light-emitting element having a high power conversion efficiency and capable of outputting light having a wavelength of 405 nm band.

The current block layer 318 (0.1 µm) which is a dielectric made of SiN is formed on a side face of the ridge of the p-type AlGaN cladding layer 316. In this structure, current is injected from the p-type GaN contact layer 317 so as to concentrate into the ridge of the p-type AlGaN cladding layer 316 through an opening of the current block layer 318, and then is intensively injected into part of the multiple quantum well active layer 314 positioned below a bottom part of the ridge of the p-type AlGaN cladding layer 316. As a result, carrier population inversion required for lasing is provided by a current injection of about a hundred milliamperes.

Light emitted, in the foregoing state, by recombination of carriers injected into the active layer is confined in the direction perpendicular to the active layer by the cladding layers 312, 316. Since the current block layer 318 has a lower refractive index than that of the cladding layer, the light is confined in the direction parallel to the active layer. Moreover, since the current block layer 318 is transparent to laser light, the current block layer 318 absorbs no light, and a low-loss waveguide can be provided.

Since the distribution of light propagating through the waveguide can greatly expand to the current block layer, $\Delta N$ in the order of $10^{-3}$, which is suitable for high-power operation, can be easily provided. Further, the magnitude of $\Delta N$ can be precisely controlled in the order of $10^{-3}$ depending on the distance (dp) between the current block layer 318 and the active layer. Thus, while light distribution can be precisely controlled, a high-power semiconductor laser operated with low operating current can be provided. In the first embodiment, light is confined in the horizontal direction with a value of $1.5 \times 10^{-3}$ being provided as $\Delta N$.

Figure 3:
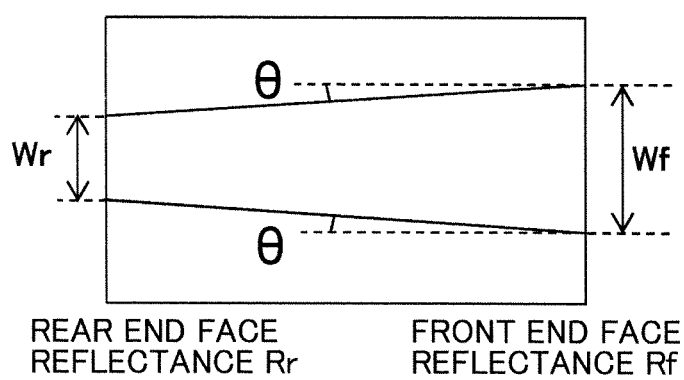
FIG. 3 is a view of a ridge-shaped stripe structure of the semiconductor light-emitting element of the first embodiment.

Next, FIG. 3 illustrates the shape of the ridge-shaped stripe of the semiconductor light-emitting element of the first embodiment in a resonator direction. Referring to FIG. 3, a front end side ridge-shaped stripe width (Wf) is greater than a rear end side ridge-shaped stripe width (Wr). That is, the ridge-shaped stripe is in such a tapered shape that Wf>Wr is satisfied. A low-reflectance coating having a reflectance Rf of 6% is formed on a front resonator end face in order to improve a light extraction efficiency, and a high-reflectance coating having a reflectance Rr of 95% is formed on a rear resonator end face. The reflectance value is not limited to the foregoing as long as Rf>Rr is satisfied.

The inclination angle (tapered angle) of the ridge-shaped stripe relative to the resonator direction is represented by "θ." The angle θ satisfies $\tan(\theta)=\Delta W_1/(2L)$, where the length of a region, where the ridge-shaped stripe width changes in the resonator direction, of the waveguide is represented by "L," and the absolute value of the difference between the ridge-shaped stripe width at a width change start point and the ridge-shaped stripe width at a width change end point (i.e., the absolute value of the difference between Wf and Wr in the present embodiment) is represented by "$\Delta W_1$."

The tapered stripe shape of the foregoing semiconductor light-emitting element which can provide high light output even in operation under high-temperature will be described. According to the present embodiment, it has been confirmed that a light output of equal to or greater than one watt can be provided even in operation under a high temperature of equal to or higher than 60° C.

Figure 4A:
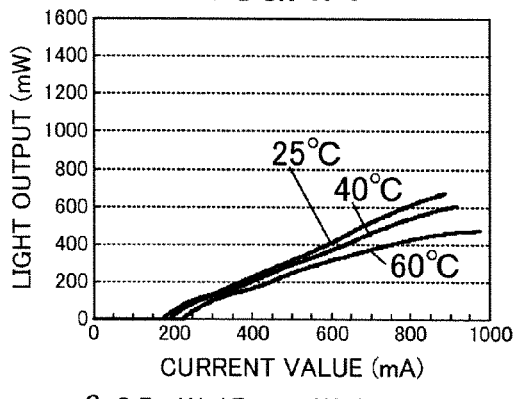
FIGS. 4A to 4F are graphs showing the temperature dependency of the current-versus-light-output characteristics of the semiconductor light-emitting element of the first embodiment in the cases different from each other in tapered angle θ provided within a range of 0° to 0.5°.

First, study has been conducted on influence of the value of tapered angle θ on the temperature characteristics of a semiconductor light-emitting element. FIGS. 4A to 4F show the temperature dependency of the current-versus-light-output characteristics of semiconductor light-emitting elements. The semiconductor light-emitting elements are similar to each other in that a resonator length is 800 μm and that a ridge-shaped stripe has a certain area (6400 μm², i.e., an average ridge-shaped stripe width of 8 μm), but are different from each other in tapered angle θ provided within a range of 0° to 0.5°. FIGS. 4A to 4F are each provided with the value of tapered angle θ and the values of Wf and Wr. Referring to FIGS. 4A to 4C, when Wr falls below 4.2 μm (i.e., the tapered angle θ exceeds 0.27°), the current-versus-light-output characteristics show a non-linear curve, and the light output tends to show thermal saturation in operation under a high temperature of 60° C. On the other hand, referring to FIGS. 4D to 4F, when Wr exceeds 5.4 μm (i.e., the tapered angle θ falls below 0.19°), the current-versus-light-output characteristics shows excellent linearity even in operation under a high temperature of 60° C., and there is no tendency of thermal saturation even in high-temperature operation with a light output of equal to or greater than one watt.

Reasons for the foregoing are as follows.

Figure 1:
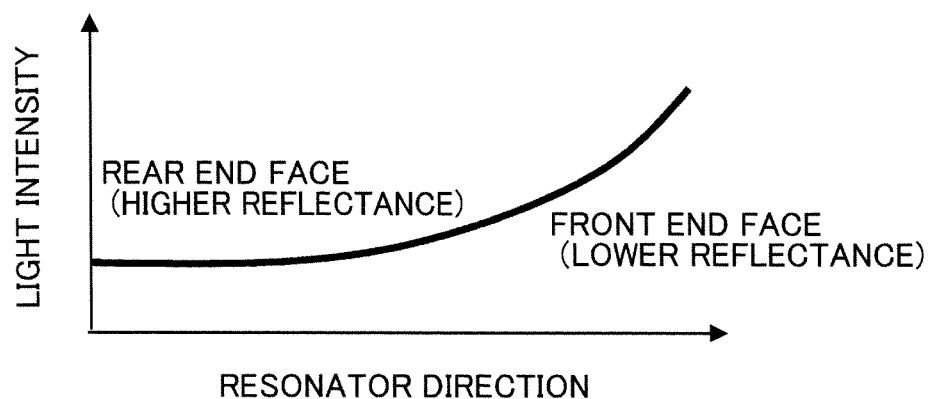
FIG. 1 is a graph showing light intensity distribution in a resonator direction and occurrence of SHB of carriers in the resonator direction.
Figure 1:
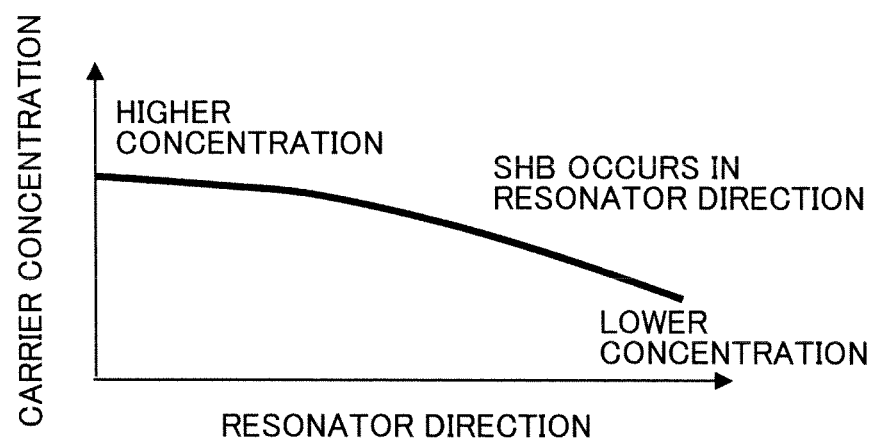

In a typical semiconductor laser having a stripe structure with a tapered angle of 0°, light intensity in an active layer is greater in a front end part of a waveguide where end face reflectance is lower as shown in FIG. 1. Thus, the number of electrons and holes injected into a front end part of the active layer and consumed by stimulated emission per unit time increases. Accordingly, SHB occurs, which is an increase in carrier concentration in the front end part of the active layer. Since a greater tapered angle results in a greater ridge-shaped stripe width on a front end side, a light density decreases with increasing a light distribution width in the horizontal direction. Thus, as the tapered angle increases, the number of electrons and electron holes consumed on the front end side per unit time decreases. Conversely, on a rear end side, an increase in tapered angle results in a smaller light distribution width in the horizontal direction and an increase in light density. Accordingly, the number of electrons and holes consumed on the rear end side per unit time increases. As result, an extremely-large tapered angle causes SHB which is a decrease in carrier concentration in a rear end part of the active layer.

As the degree of SHB increases, carrier overflow which is leakage of electrons and holes from the active layer to a cladding layer due to then thermal excitation of the electrons and the holes increasingly occurs in part of the active layer where the carrier concentration is greater, resulting in lowering of the thermal saturation level of light output.

When SHB occurs in the resonator direction, there is variation in wavelength at which the maximum amplification gain is obtained in the active layer, resulting in an increase in lasing current threshold. As the lasing threshold current increases, carrier overflow in operation under high temperature increasingly occurs. This leads to degradation of temperature characteristics.

Next, study has been conducted on influence of the order of high-order transverse modes of light guided in a waveguide on the temperature characteristics of a semiconductor light-emitting element.

With a small Wr, light in higher-order horizontal transverse modes cannot be guided, and is cut off. Thus, the number of horizontal transverse modes of laser which can be output decreases.

The order of high-order transverse modes of light guided in the waveguide is limited by the ridge-shaped stripe width. In the tapered waveguide as described in the present embodiment, the order of high-order transverse modes of guidable light is determined depending on Wr which is the minimum width.

When the transverse modes are coupled together during lasing operation, the shape of light distribution in the resonator direction changes. In the case where light in the high-order transverse modes is not cut off (i.e., Wr is large enough to allow the high-order transverse modes), a lower order of high-order transverse modes of laser light which can be simultaneously output results in greater change in light distribution shape, and the current-versus-light-output characteristics show great non-linearity. That is, poor temperature characteristics are exhibited.

It is necessary for a watt-class high-power laser to reduce the series resistance of a semiconductor light-emitting element to reduce self-heating of the semiconductor light-emitting element during operation. Thus, a ridge-shaped stripe width large enough to guide light not only in a fundamental transverse mode but also in the high-order transverse modes is preferable for watt-class high-power operation. However, an extremely-large ridge-shaped stripe width increases a lasing threshold current, and therefore heat generation of the semiconductor light-emitting element right after lasing and power consumption of the semiconductor light-emitting element increase.

Figure 4D:
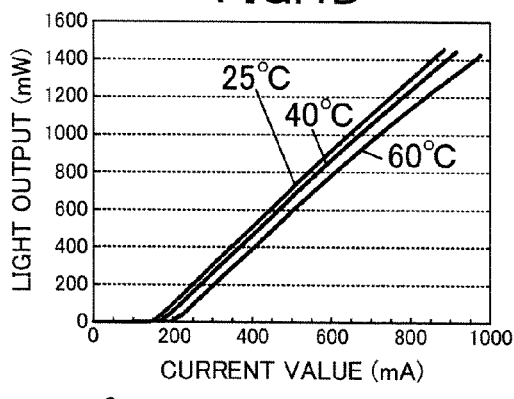
Figure 4B:
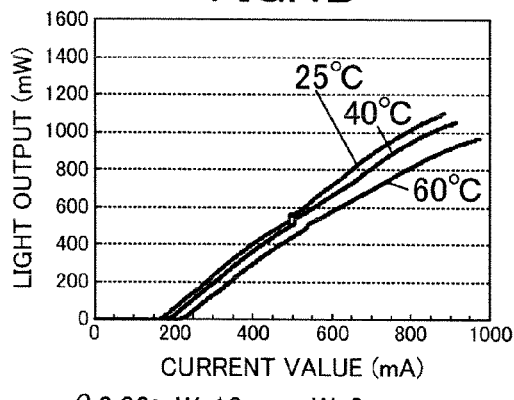
Figure 4E:
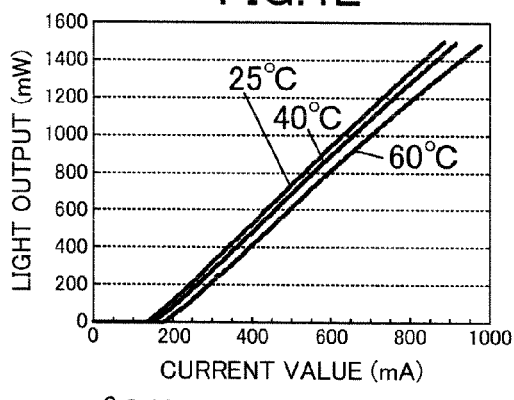
Figure 4C:
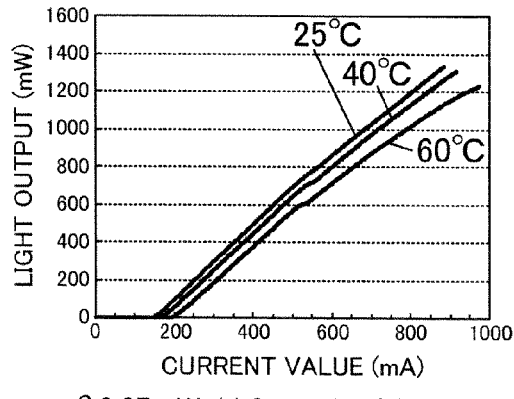

Thus, study has been conducted again on FIGS. 4A to 4F, considering the order of high-order transverse modes of light guided in the waveguide. FIGS. 4A to 4F are different from each other in Wr provided within a range of 1 to 8 μm. FIG. 4A shows the structure where Wr is 1 μm, and only light in the fundamental transverse mode can be guided at 25° C. FIG. 4B shows the structure where Wr is 3 μm, and light in the fundamental transverse mode and a first order transverse mode can be guided at 25° C. FIG. 4C shows the structure where Wr is 4.2 μm, and light in the fundamental transverse mode, the first order transverse mode, and a second order transverse mode can be guided at 25° C. FIG. 4D shows the structure where Wr is 5.4 μm, and light in the fundamental transverse mode, the first order transverse mode, the second order transverse mode, and a third order transverse mode can be guided at 25° C.

In the structure shown in FIG. 4A, only light in the fundamental transverse mode can be guided at 25° C. However, since the change in ridge-shaped stripe width in the resonator direction in the tapered structure is extremely large, SHB which is a decrease in carrier concentration in the rear end part of the active layer occurs as described above. In this case, even in operation in the fundamental transverse mode right after lasing, self-heating of the semiconductor light-emitting element increases due to a low light-emitting efficiency. As a result, the difference (ΔN) in effective refractive index between the inside of the ridge-shaped stripe and the outside of the ridge-shaped stripe increases with increasing an operating current value. Consequently, light in the high-order transverse modes is not cut off (i.e., light in the high-order transverse modes can be guided), and the current-versus-light-output characteristics have kinks. Thus, FIG. 4A shows the following characteristics: a slop efficiency is low; kinks are exhibited at a light output of about 150 mW; and the thermal saturation level of light output is about 500 mW at 60° C.

In the structure shown in FIG. 4B, light in the fundamental transverse mode and the first order transverse mode can be guided at 25° C. However, the change in ridge-shaped stripe width in the resonator direction in the tapered structure is extremely large as in the structure shown in FIG. 4A. As a result, SHB which is a decrease in carrier concentration in the rear end part of the active layer occurs as described above.

Thus, a slope efficiency is lower in the tapered structure shown in FIG. 4B than in a typical straight stripe structure. Moreover, the thermal saturation level of light output is about 1000 mW at 60° C. The structure shown in FIG. 4B is not favorable as a watt-class laser. Further, since the current-versus-light-output characteristics have kinks at a light output of about 500 mW, and show poor linearity, this structure shows instable characteristics. With such characteristics, the operating characteristics of semiconductor light-emitting elements are not stable, and variation in operating characteristics among the semiconductor light-emitting elements increases even if the semiconductor light-emitting elements are, in mass production, manufactured so as to have the same stripe structure.

Particularly considering high-power operation with an output of equal to or greater than one watt, the degree of variation in operating current value influences variation in active layer temperature during operation of a semiconductor light-emitting element, and therefore there is great variation in guarantee time for ensuring the long-term reliability of the semiconductor light-emitting element. Thus, it is significantly important for lasers operated in high-order transverse modes to provide current-versus-light-output characteristics showing excellent linearity without kinks significantly degrading the linearity. The current-versus-light-output characteristics shown in FIG. 4B have a significant adverse effect on a practical use.

In the structure shown in FIG. 4C, light in the fundamental transverse mode, the first order transverse mode, and the second order transverse mode can be guided at 25° C. In such a tapered stripe structure, the change in ridge-shaped stripe width in the resonator direction is smaller than that in the structures shown in FIGS. 4A and 4B. Thus, occurrence of SHB is relatively reduced, and a slope efficiency is improved. However, in this structure, the current-versus-light-output characteristics also have kinks at a light output of about 600 mW, resulting in unstable characteristics. With such characteristics, the operating characteristics of semiconductor light-emitting elements are not stable, and variation in operating characteristics among the semiconductor light-emitting elements increases even if the semiconductor light-emitting elements are, in mass production, manufactured so as to have the same stripe structure.

Particularly considering high-power operation with an output of equal to or greater than one watt, the degree of variation in operating current value influences variation in active layer temperature during operation of a semiconductor light-emitting element, and therefore there is great variation in guarantee time for ensuring the long-term reliability of the semiconductor light-emitting element. Thus, as in the foregoing, it is significantly important for lasers operated in high-order transverse modes to provide current-versus-light-output characteristics showing excellent linearity without kinks significantly degrading the linearity.

The current-versus-light-output characteristics shown in FIG. 4C have a significant adverse effect on a practical use.

In the structure shown in FIG. 4D, light in the fundamental transverse mode, the first order transverse mode, the second order transverse mode, and the third order transverse mode can be guided at 25° C. In such a tapered stripe structure, the change in ridge-shaped stripe width in the resonator direction is much smaller than that in the structures shown in FIGS. 4A to 4C. Thus, occurrence of SHB is relatively reduced, and a slope efficiency is improved to such a level that the slope efficiency of the structure shown in FIG. 4D slightly exceeds that of the typical straight stripe structure shown in FIG. 4F. In this tapered stripe structure, there are no kinks degrading the linearity of the current-versus-light-output characteristics. This is because of the following reason. The number of the order of transverse modes of guided light is high. Thus, even if electric fields of light in the transverse modes are coupled together, and the shape of light distribution in the resonator direction changes accordingly, the influence of such change is small.

In the structure shown in FIG. 4E, light in the fundamental transverse mode, the first order transverse mode, the second order transverse mode, and the third order transverse mode can be guided at 25° C. In such a tapered stripe structure, the change in ridge-shaped stripe width in the resonator direction is much smaller than that in the structures shown in FIGS. 4A to 4D. Thus, occurrence of SHB is relatively reduced, and a slope efficiency in operation under a temperature of 25° C. is improved as much as 1.03 times compared to that of the typical straight stripe structure shown in FIG. 4F. In this tapered stripe structure, there are no kinks degrading the linearity of the current-versus-light-output characteristics. As in the structure shown in FIG. 4D, this is because of the following reasons. The number of the order of transverse modes of guided light is high. Thus, even if electric fields of light in the transverse modes are coupled together, and the shape of light distribution in the resonator direction changes accordingly, the influence of such change is small.

Figure 4F:
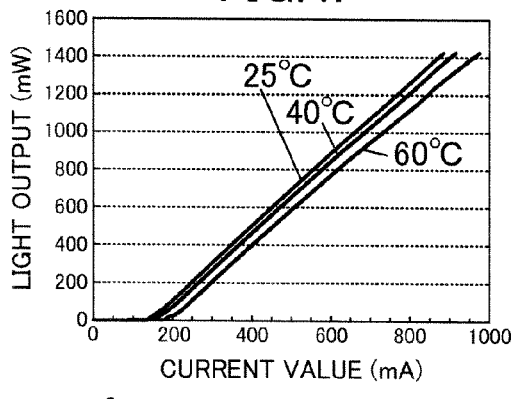

In the structure shown in FIG. 4F, light in the fundamental transverse mode, the first order transverse mode, the second order transverse mode, the third order transverse mode, and a fourth order transverse mode can be guided at 25° C. In this structure, there are also no kinks degrading the linearity of the current-versus-light-output characteristics.

The study results of FIGS. 4A to 4F show that, even if laser light in the high-order transverse modes is output from the laser in which light in the high-order transverse mode is not cut off and the ridge-shaped stripe width is large, the laser may be, in order to avoid adverse effect causing the non-linearity of the current-versus-light-output characteristics, configured such that light in the higher-order transverse modes than the third order transverse mode is guidable.

The results also show that, in the tapered stripe structure in which light in the higher-order transverse modes than the third order transverse mode is guidable, a tapered angle θ of around 0.1° allows reduction in occurrence of SHB and improvement in slope efficiency in association with the current-versus-light-output characteristics.

A conventional tapered stripe structure is intended to amplify or output only light in a fundamental transverse mode and to attenuate light in high-order transverse modes other than the fundamental transverse mode. This is because it is necessary that, in the case of using, e.g., a semiconductor laser as a light source of a laser for optical disk or a light source for welding, a lens is used to concentrate output light to a single point to the diffraction limit of the lens to provide a spot diameter as small as possible.

In an attempt to provide a watt-class nitride-based semiconductor laser capable of performing operation in a fundamental transverse mode, it is difficult to provide an end-face window structure, and therefore it is necessary to increase a stripe width on a front end side. Moreover, it is necessary for cutting-off of light in high-order transverse modes to narrow the ridge-shaped stripe width down to equal to or less than about 1 μm.

Considering the foregoing, in order to provide a watt-class ultra-high-power semiconductor laser capable of performing operation in a fundamental transverse mode by a tapered stripe structure, a ridge-shaped stripe width on a rear end side should be about 1 μm, and a ridge-shaped stripe width on a front end side, i.e., the side from which light is extracted, should be within a range of about 8 μm to about 15 μm. If the ridge-shaped stripe width changes, as just described, in a resonator direction in the case of a resonator length of about 1000 μm, the ratio of stripe width change in the resonator direction becomes extremely high. Consequently, not only great SHB occurs, but also waveguide loss in the fundamental transverse mode increases.

As a result, an external differential quantum efficiency in association with current-versus-light-output characteristics is lowered, and the thermal saturation level of light output in operation under high temperature is lowered. Thus, in order to provide characteristics which allow a semiconductor light-emitting element capable of performing operation in a fundamental transverse mode to perform high-power operation under high temperature, it is necessary that a resonator length is equal to or longer than about 2000 μm. In this case, even if watt-class high-power operation can be provided, an operating current value increases due to a long resonator length, resulting not only in lowering of a power conversion efficiency but also in an increase in cost for manufacturing the semiconductor light-emitting element.

However, the present inventors have focused on the following point. In, e.g., a watt-class semiconductor laser requested as a light source for projector, it is not necessary that output light is concentrated to the diffraction limit of a lens. Thus, the semiconductor laser does not necessarily perform operation only in a fundamental transverse mode, and may be output laser in high-order transverse modes. As a result of focusing on such a point, a semiconductor light-emitting element capable of performing watt-class high-power operation and having a high power conversion efficiency as in the present embodiment can be provided.

Figure 5A:
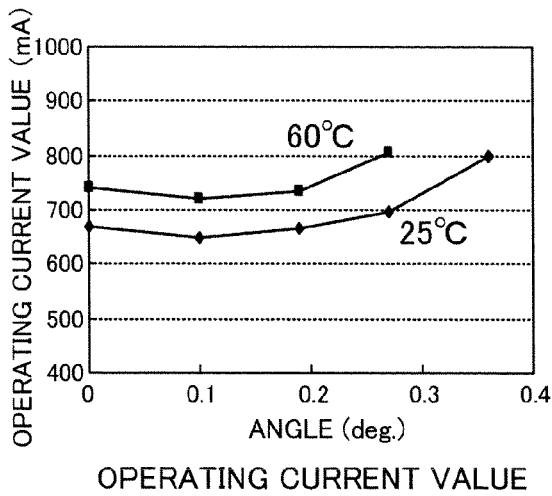
FIGS. 5A to 5C are graphs showing the dependency of an operating current value, an operating voltage, and a power conversion efficiency on a tapered angle θ in the semiconductor light-emitting element of the first embodiment.
Figure 5C:
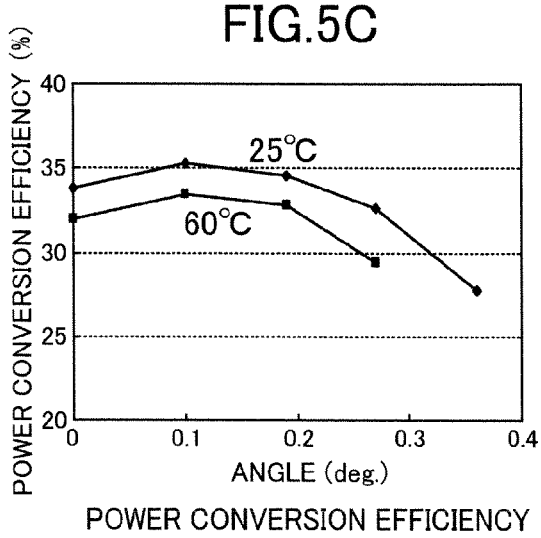
Figure 5B:
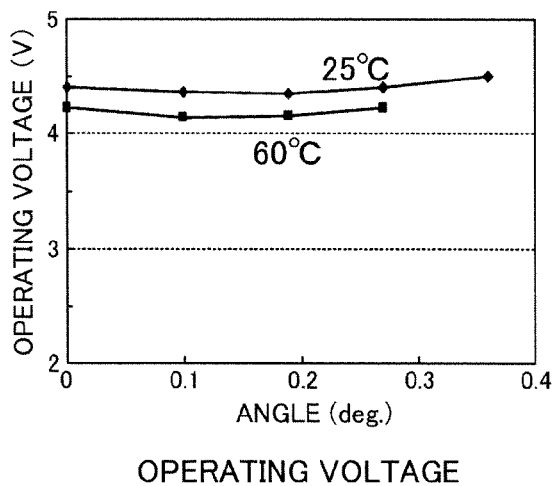

FIGS. 5A to 5C show the dependency of an operating current value, an operating voltage, and a power conversion efficiency (WPE) on a tapered angle θ in the semiconductor light-emitting elements with the tapered stripe structures as shown in FIGS. 4A to 4F. FIGS. 5A to 5C show that, within a tapered angle range of equal to or higher than 0.05° and equal to or lower than 0.15°, the operating voltage is maintained constant. However, the operating current value decreases, and the WPE is the maximum at a tapered angle of 0.1°. This is because occurrence of SHB and carrier overflow is reduced at a tapered angle of around 0.1°, and electrons and holes are, by stimulated emission, most efficiently consumed in the active layer.

Since light in the fundamental transverse mode, the first order transverse mode, the second order transverse mode, and the third order transverse mode can be guided in the tapered stripe structure, the linearity of the current-versus-light-output characteristics can be enhanced. As a result, favorable temperature characteristics can be provided. By setting the tapered angle at a preferable angle of equal to or higher than 0.05° and equal to or lower than 0.15° or a more preferable angle of 0.1°, occurrence of SHB can be reduced, and more favorable temperature characteristics can be provided.

Next, the relationship between the tapered angle θ and occurrence of SHB in the resonator direction will be described with reference to carrier concentration distribution in the active layer of the semiconductor light-emitting element of the first embodiment during operation.

Figure 6A:
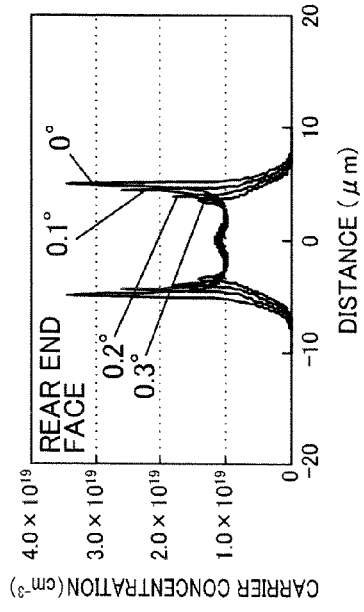
FIGS. 6A to 6D are graphs showing carrier concentration distribution in the horizontal direction depending on tapered angles in the semiconductor light-emitting element of the first embodiment.
Figure 6B:
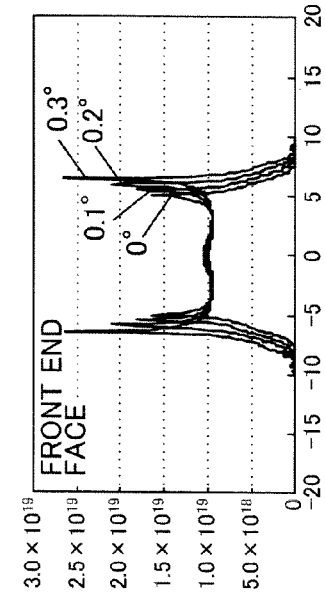
Figure 6C:
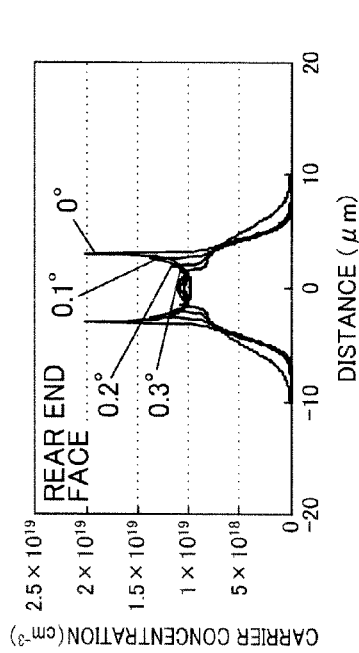
Figure 6D:
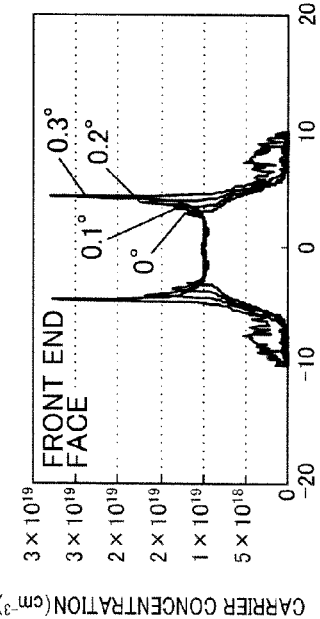

First, FIGS. 6A to 6D show the carrier concentration distribution in the front end part and the rear end part of the active layer in one-watt operation. FIGS. 6A to 6D are similar to each other in that the resonator length is 550 μm, but are different from each other in tapered shape (tapered angle θ provided within a range of 0° to 0.3°). FIGS. 6A and 6B show the carrier concentration distribution in the case of the tapered shapes having an average ridge-shaped stripe width of 6 μm, and FIGS. 6C and 6D show the carrier concentration distribution in the case of the tapered shapes having an average ridge-shaped stripe width of 12 μm. Moreover, FIGS. 6A and 6C show the carrier concentration distribution on the rear end side, and FIGS. 6B and 6D show the carrier concentration distribution on the front end side.

Figure 7A:
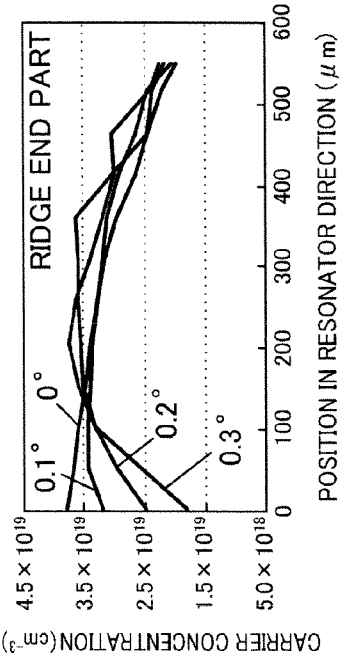
FIGS. 7A to 7D are graphs showing carrier concentration distribution in the resonator direction depending on tapered angles in the semiconductor light-emitting element of the first embodiment.
Figure 7B:
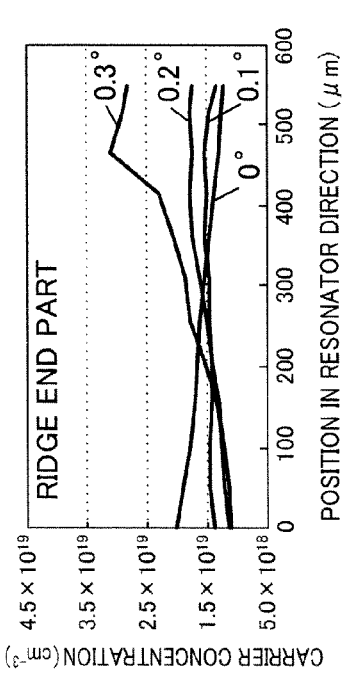
Figure 7C:
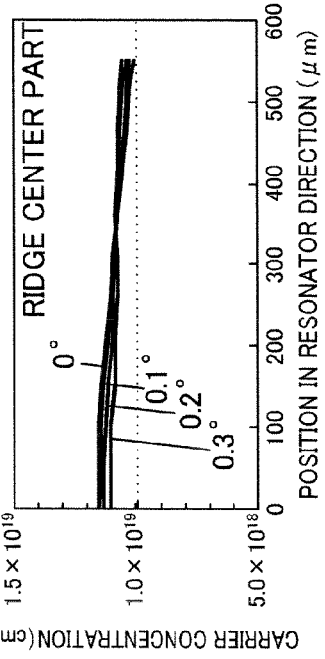
Figure 7D:
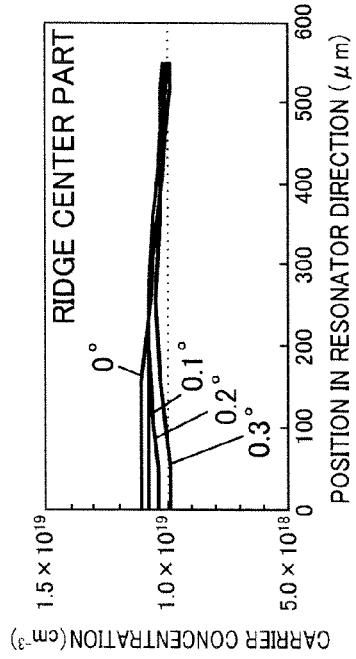

FIGS. 7A to 7D each show the change in carrier concentration in part of the active layer right below a center part of the ridge in the resonator direction in one-watt operation, or the change in carrier concentration in part (part of the active layer right below an end part of the ridge) of the active layer where the carrier concentration shown in FIGS. 6A to 6D is the maximum in the resonator direction in one-watt operation. FIGS. 7A to 7D are similar to each other in that the resonator length is 550 μm, but are different from each other in tapered shape (tapered angle θ provided within a range of 0° to 0.3°). FIGS. 7A and 7B show the change in carrier concentration in the case of the tapered shapes having an average ridge-shaped stripe width of 6 μm, and FIGS. 7C and 7D show the change in carrier concentration in the case of the tapered shapes having an average ridge-shaped stripe width of 12 μm. Moreover, FIGS. 7A and 7C show the change in carrier concentration in the ridge end part, and FIGS. 7B and 7D show the change in carrier concentration in the ridge center part.

Figure 8A:
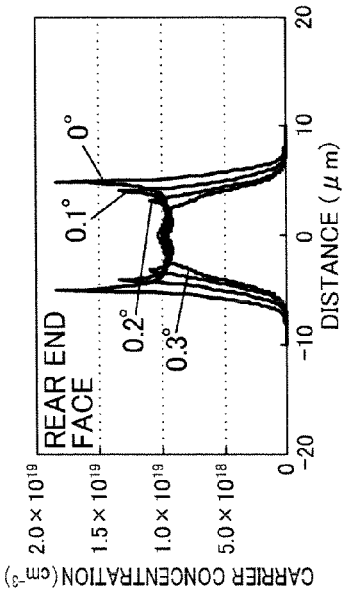
FIGS. 8A to 8D are graphs showing carrier concentration distribution in the horizontal direction depending on tapered angles in the semiconductor light-emitting element of the first embodiment.
Figure 8B:
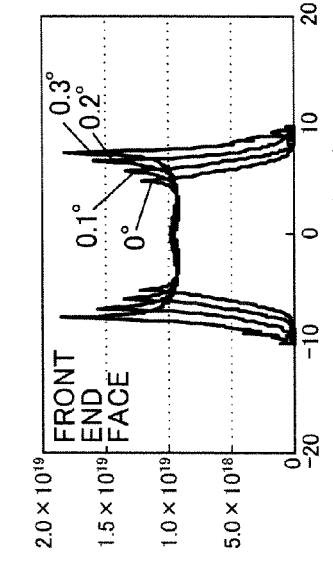
Figure 8C:
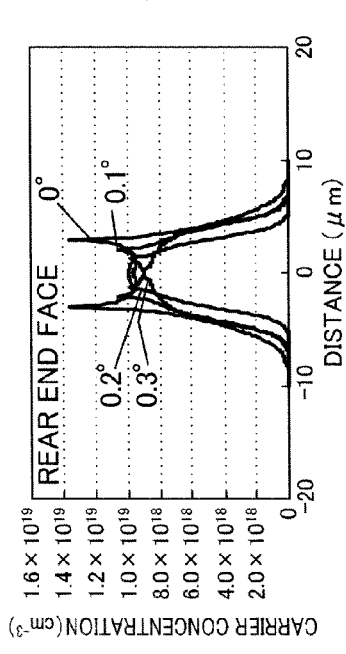
Figure 8D:
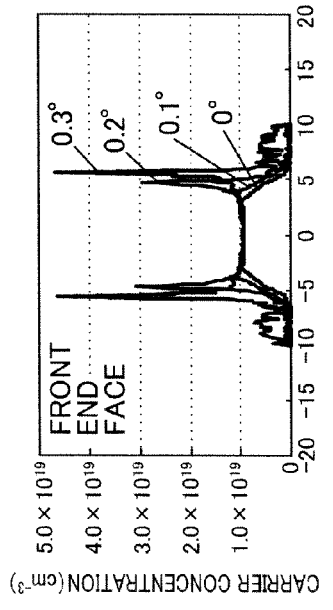

Next, FIGS. 8A to 8D show carrier concentration distribution in the front end part and the rear end part of the active layer in one-watt operation. FIGS. 8A to 8D are similar to each other in that the resonator length is 1000 µm, but are different from each other in tapered shape (tapered angle θ provided within a range of 0° to 0.3°). FIGS. 8A and 8B show the carrier concentration distribution in the case of the tapered shapes having an average ridge-shaped stripe width of 6 µm, and FIGS. 8C and 8D show the carrier concentration distribution in the case of the tapered shapes having an average ridge-shaped stripe width of 12 µm. Moreover, FIGS. 8A and 8C show the carrier concentration distribution on the rear end side, and FIGS. 8B and 8D show the carrier concentration distribution on the front end side.

Figure 9A:
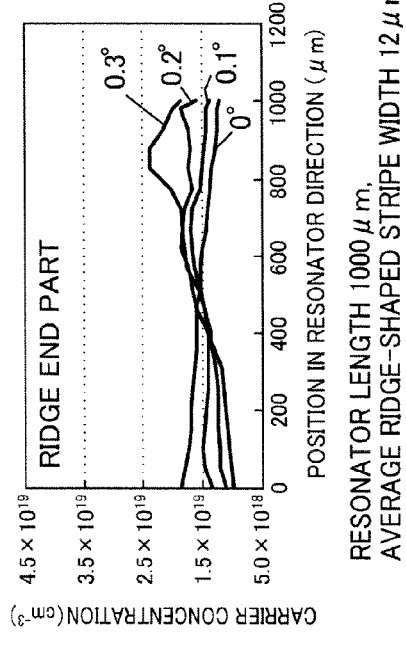
FIGS. 9A to 9D are graphs showing carrier concentration distribution in the resonator direction depending on tapered angles in the semiconductor light-emitting element of the first embodiment.
Figure 9B:
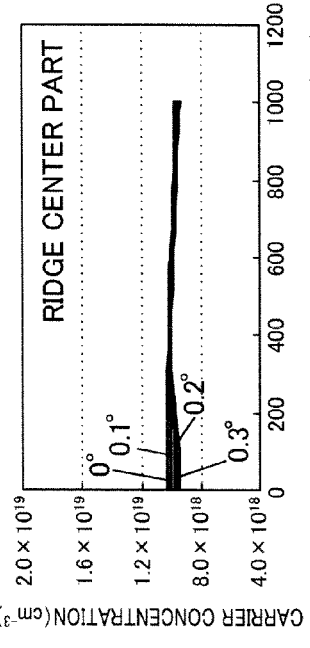
Figure 9C:
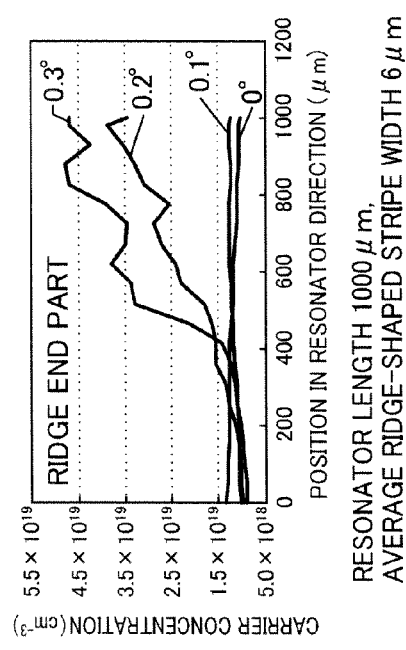
Figure 9D:
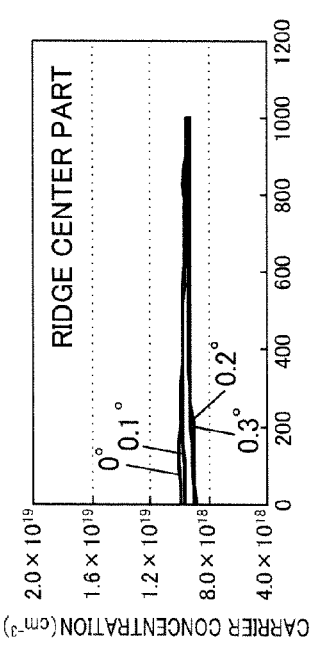

For the semiconductor light-emitting element of the first embodiment, FIGS. 9A to 9D each show the change in carrier concentration in part of the active layer right below the center part of the ridge in the resonator direction in one-watt operation, or the change in carrier concentration in part (part of the active layer right below the vicinity of the end part of the ridge) of the active layer where the carrier concentration shown in FIGS. 8A to 8D is the maximum in the resonator direction in one-watt operation. FIGS. 9A to 9D are similar to each other in that the resonator length is 1000 µm, but are different from each other in tapered shape (tapered angle θ provided within a range of 0° to 0.3°). FIGS. 9A and 9B show the change in carrier concentration in the case of the tapered shapes having an average ridge-shaped stripe width of 6 µm, and FIGS. 9C and 9D show the change in carrier concentration in the case of the tapered shapes having an average ridge-shaped stripe width of 12 µm. Moreover, FIGS. 9A and 9C show the change in carrier concentration in the ridge end part, and FIGS. 9B and 9D show the change in carrier concentration in the ridge center part.

Referring to FIGS. 6 to 9, in any of the stripe structures, the difference in carrier concentration in the active layer during operation is small in the case of a tapered angle of 0.1°. That is, in such a case, occurrence of SHB is most reduced. This shows that, in the case of the semiconductor laser capable of outputting laser light having a wavelength of 405 nm band, occurrence of SHB is reduced in such a manner that the tapered angle is set at a preferable angle of 0.05° to 0.15° or a more preferable angle of 0.1° in the ridge-shaped stripe of the semiconductor laser in which the average ridge-shaped stripe falls within a range of 6 to 12 µm and the resonator length falls within a range of 550 to 1000 µm. Thus, by setting the tapered angle θ at a preferable angle of 0.05° to 0.15° or a more preferable angle of 0.1° in the ridge-shaped stripe of the semiconductor laser in which the average ridge-shaped stripe falls within a range of 6 to 12 m and the resonator length falls within a range of 550 to 1000 µm, a high-power laser having excellent temperature characteristics and exhibiting high-level thermal saturation can be provided.

The tapered stripe shape described above reduces occurrence of SHB in the resonator direction, and provides a uniform carrier concentration.

In the case of the conventional straight stripe structure, the carrier concentration in the active layer is relatively higher on the rear end side than on the front end side. Due to such a state, growth of lattice defects in the high-carrier-concentration region of the active layer occurs, resulting in lowering of the long-term reliability of the semiconductor light-emitting element.

On the other hand, according to the tapered stripe structure of the present embodiment, in high-power operation with an output of equal to or greater than one watt, the operating current value is low, and self-heating of the semiconductor light-emitting element is reduced. Further, there is another advantage that the carrier concentration in the resonator direction is maintained constant. Thus, even with a short resonator length of equal to or longer than 550 µm and equal to or shorter than 1000 µm, growth of lattice defects in the active layer is reduced, and long-term reliability is improved.

Second Embodiment

In the first embodiment, it has been described that the tapered angle is set at an angle of 0.05° to 0.15° or a preferable angle of 0.1° to reduce occurrence of SHB. However, even with such a tapered angle range, the carrier concentration in part of the active layer right below the vicinity of the end part of the ridge is higher than that in part of the active layer right below the center part of the ridge. This shows that occurrence of SHB in the horizontal direction is not completely reduced.

For such a reason, in a second embodiment, the structure for more effectively reducing occurrence of SHB in the horizontal direction and further improving temperature characteristics will be described.

Figure 10:
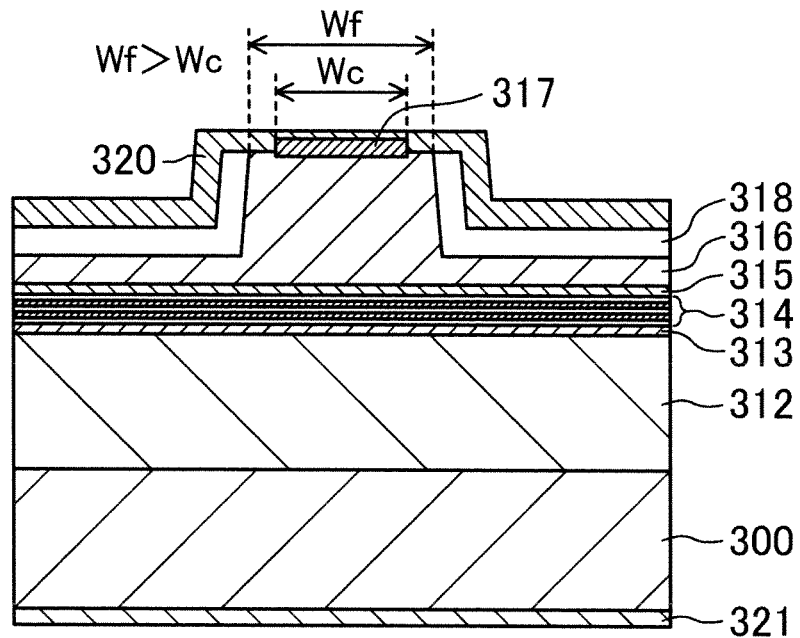
FIG. 10 is a cross-sectional view of a semiconductor light-emitting element of a second embodiment of the present disclosure.

FIG. 10 is a cross-sectional view of a semiconductor light-emitting element of the second embodiment of the present disclosure. Such a structure is different from the cross-sectional structure (see FIG. 2) of the semiconductor light-emitting element of the first embodiment in the width (the width of a front end part is represented by "Wc") of a p-type GaN contact layer 317 formed on a p-type AlGaN cladding layer 316. In the semiconductor light-emitting element of the present embodiment, Wf>Wc is satisfied, where a front end side ridge-shaped stripe width is represented by "Wf."

Figure 11:
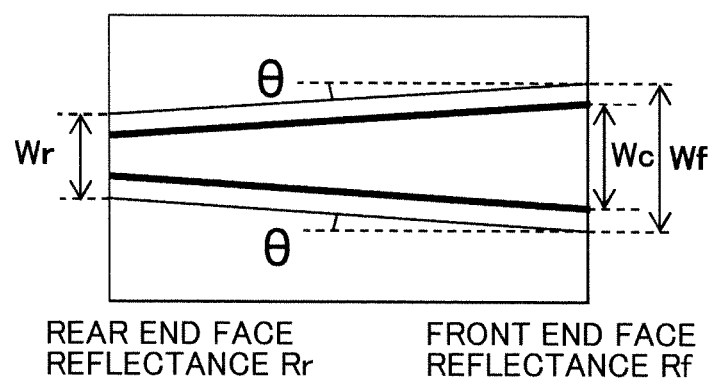
FIG. 11 is a view illustrating a ridge-shaped stripe structure and a current injection stripe structure of the semiconductor light-emitting element of the second embodiment.

FIG. 11 illustrates the shape of a ridge-shaped stripe of the semiconductor light-emitting element of the second embodiment in a resonator direction. Referring to FIG. 11, the ridge-shaped stripe is in such a tapered shape that the front end side ridge-shaped stripe width (Wf) is greater than a rear end side ridge-shaped stripe width (Wr). Moreover, the width of the p-type GaN contact layer 317 is, at any positions in the resonator direction, smaller than that of a top part of the ridge-shaped stripe formed at the p-type AlGaN cladding layer 316 by ΔW (=Wf−Wc). A low-reflectance coating having a reflectance of 6% is formed on a front resonator end in order to improve a light extraction efficiency, and a high-reflectance coating having a reflectance of 95% is formed on a rear resonator end. This is similar to the semiconductor light-emitting element of the first embodiment.

For the stripe shapes each having an average ridge-shaped stripe width (the average of the width of the top part of the ridge-shaped stripe formed at the p-type AlGaN cladding layer 316) of 6 µm, 9 µm, or 12 µm and having a resonator length of 1000 µm or 550 µm, the degree of SHB, i.e., variation in carrier concentration, in an active layer during one-watt operation in the foregoing structure was obtained by calculation of ΔNhb.

The difference between the maximum value of the carrier concentration in the active layer and the minimum value of the carrier concentration in part of the active layer right below a center part of the ridge is represented by "ΔNhb." In the case of a small ΔNhb, the carrier concentration in the active layer is substantially uniform, and therefore it is assumed that occurrence of SHB in the active layer is reduced.

Figure 12A:
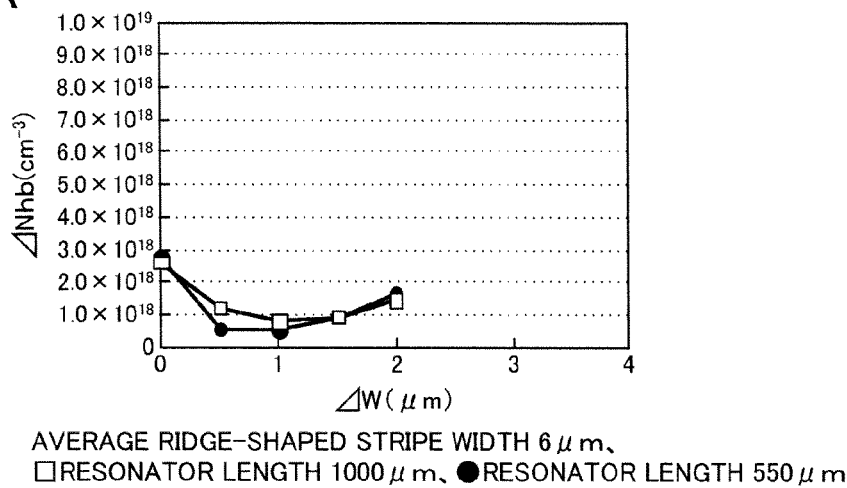
FIGS. 12A to 12C are graphs showing the ΔW dependency of occurrence of SHB of carriers in the semiconductor light-emitting element of the second embodiment.
Figure 12B:
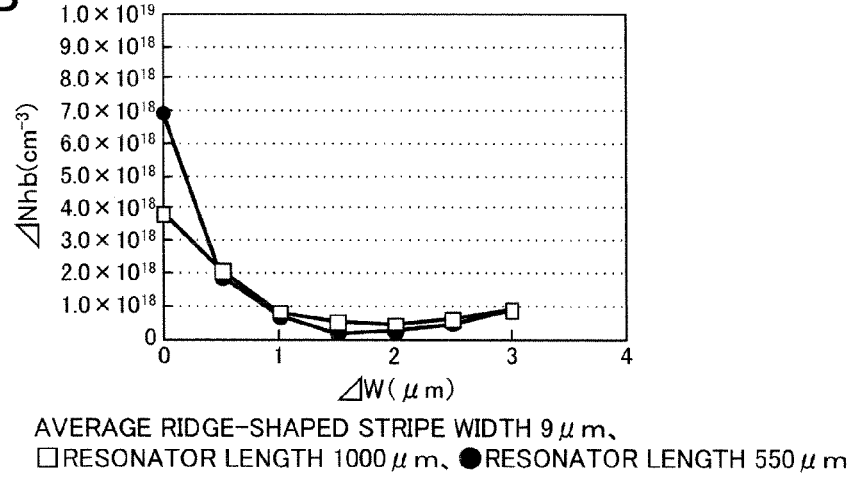
Figure 12C:
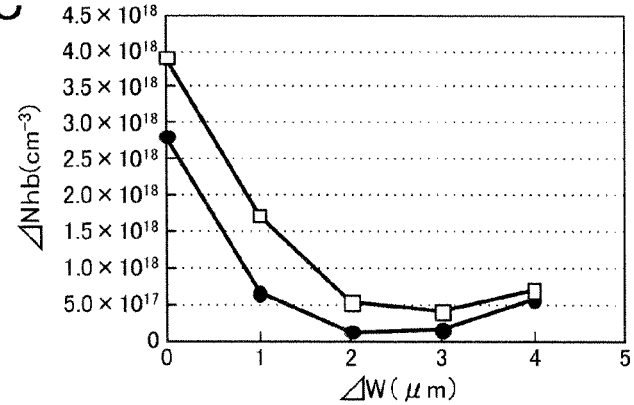
Figure 13A:
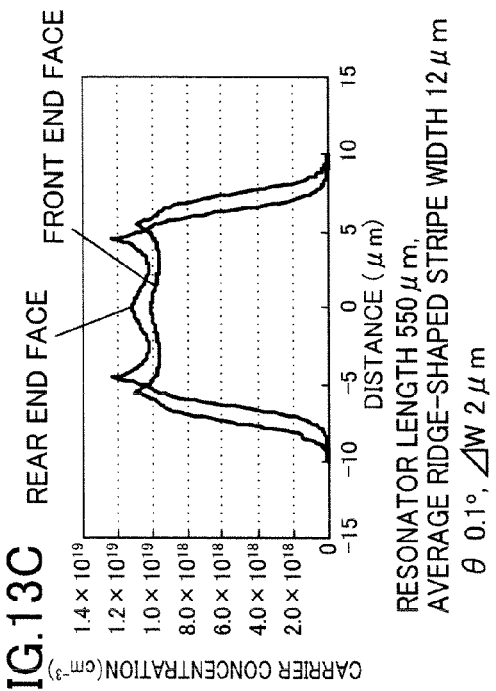
FIGS. 13A to 13D are graphs showing carrier concentration distribution in the horizontal direction in the semiconductor light-emitting element of the second embodiment.
Figure 13C:
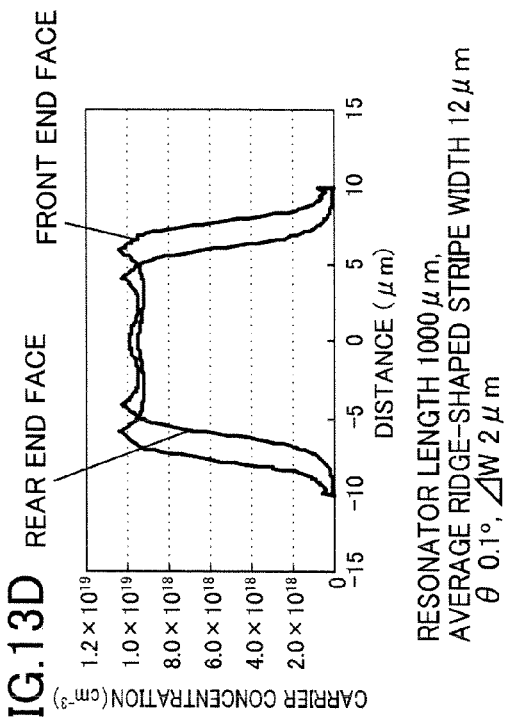
Figure 13B:
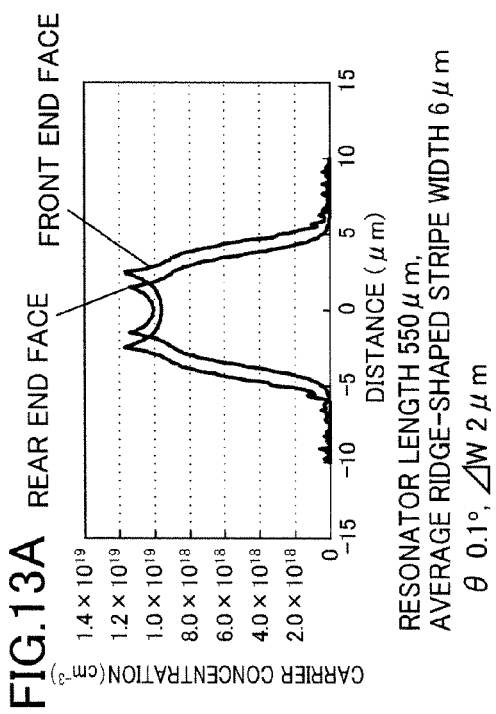
Figure 13D:
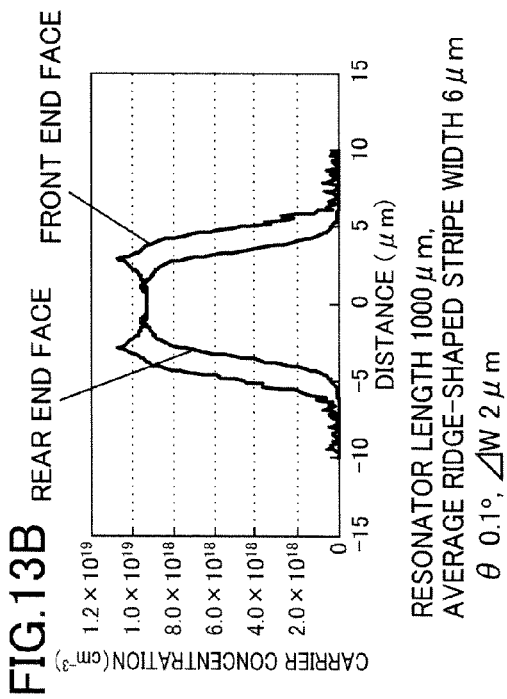
Figure 14A:
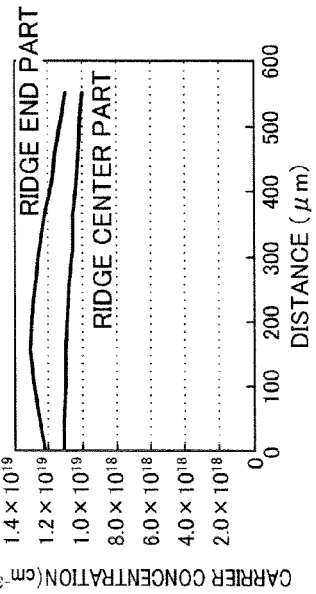
FIGS. 14A to 14D are graphs showing carrier concentration distribution in a resonator direction in the semiconductor light-emitting element of the second embodiment.
Figure 14C:
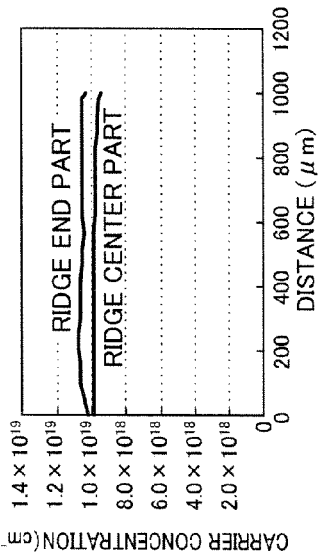
Figure 14B:
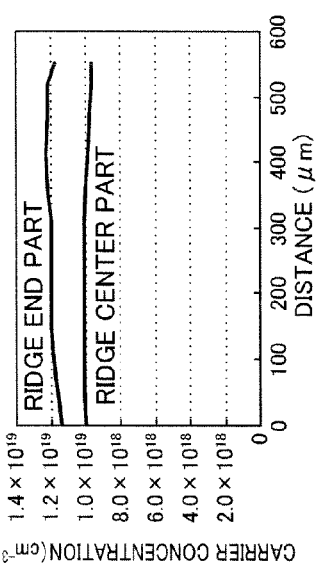
Figure 14D:
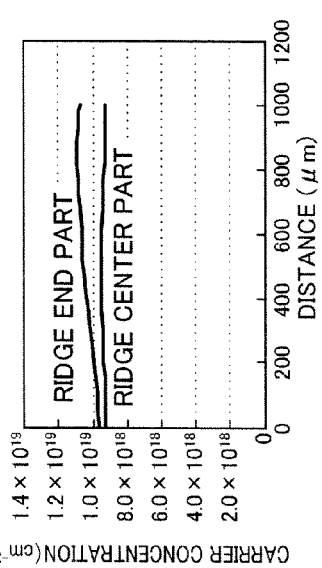
Figure 15A:
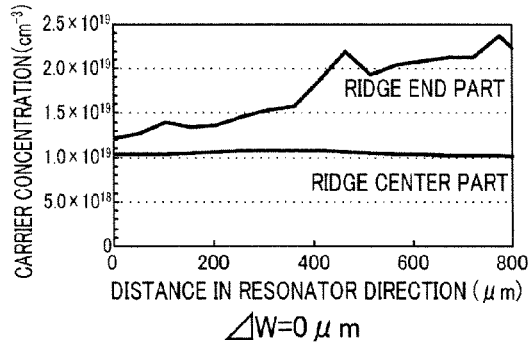
FIGS. 15A to 15H are graphs showing the ΔW dependency of a carrier concentration in the semiconductor light-emitting element of the second embodiment in the case where an average ridge-shaped stripe width is 8 µm, a resonator length is 800 µm, and a tapered angle is 0.1°.
Figure 15B:
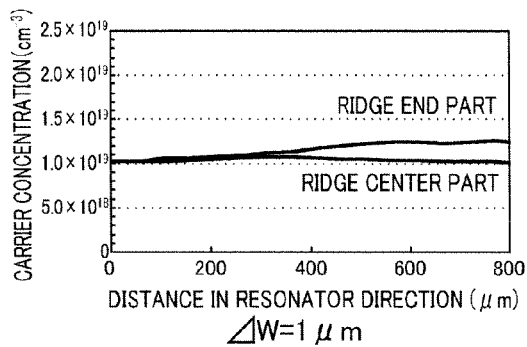
Figure 15C:
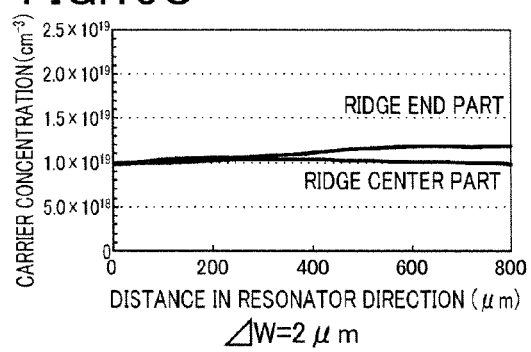
Figure 15D:
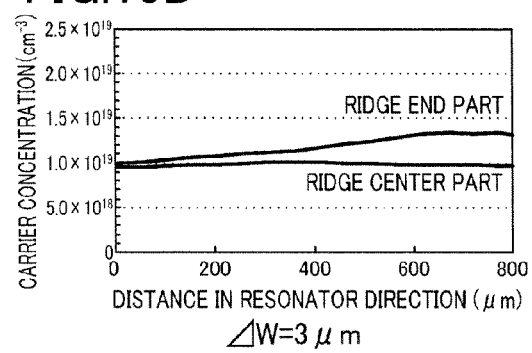
Figure 15E:
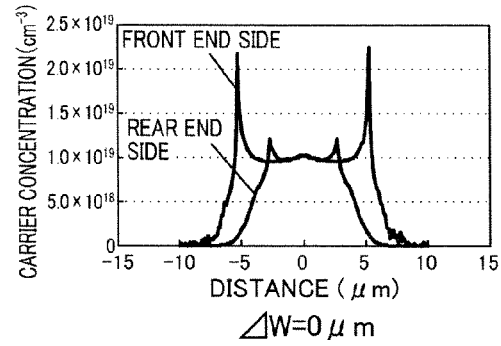
Figure 15F:
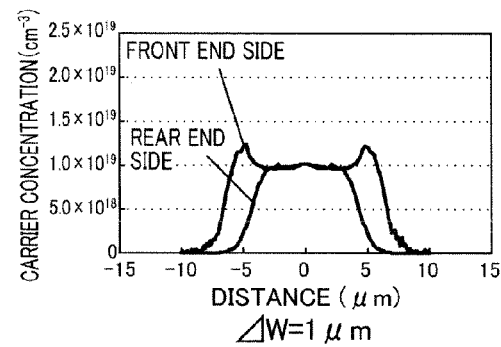
Figure 15G:
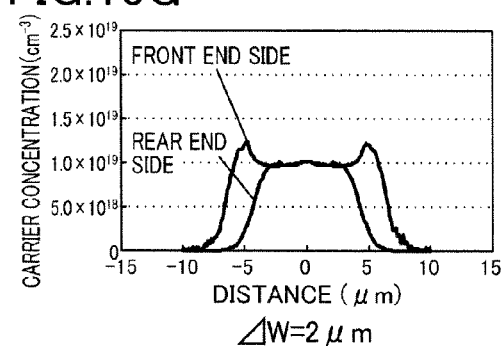
Figure 15H:
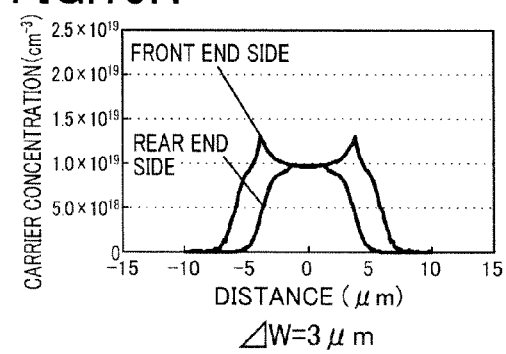

FIGS. 12A to 12C show ΔW dependency of ΔNhb in the foregoing stripe shapes.

FIG. 12A shows that, in the case of an average ridge-shaped stripe width of 6 µm, ΔNhb decreases within a ΔW range of 0.5 to 2 µm, reaches the minimum value at a ΔW of around 1 µm, and then gradually increases with increasing ΔW.

Moreover, FIG. 12B shows that, in the case of an average ridge-shaped stripe width of 9 µm, ΔNhb decreases within a ΔW range of 0.5 to 3 μm, reaches the minimum value at a ΔW of around 2 μm, and then gradually increases with increasing ΔW.

Further, FIG. 12C shows that, in the case of an average ridge-shaped stripe width of 12 μm, ΔNhb decreases within a ΔW range of 1 to 4 μm, reaches the minimum value at a ΔW of around 3 μm, and then gradually increases with increasing ΔW.

That is, when the average ridge-shaped stripe width is $W_{ave}$ (μm), if the magnitude of ΔW (μm) is $(W_{ave}/3-1)$ μm, ΔNhb is at the minimum value. When the resonator length is within a range of 550 to 1000 μm, and the average ridge-shaped stripe width is within a range of 6 to 12 μm, if ΔW is set within a preferable range of $((W_{ave}/3-1)\pm1)$ μm or a more preferable range of $((W_{ave}/3-1)\pm0.5)$ μm, ΔNhb can be reduced.

For the tapered shapes each having a resonator length of 550 or 1000 μm, having an average ridge-shaped stripe width of 6 or 12 μm, having a tapered angle of 0.1°, and having a ΔW of 2 μm, FIGS. 13A to 13D show carrier concentration distribution on a front end side and a rear end side in an active layer.

For the tapered shapes each having a resonator length of 550 or 1000 μm, having an average ridge-shaped stripe width of 6 or 12 μm, having a tapered angle of 0.1°, and having a ΔW of 2 μm, FIGS. 14A to 14D show the carrier concentration in part of an active layer right below the vicinity of a center part of a ridge and the resonator-direction dependency of the maximum value of the carrier concentration (carrier concentration in part of the active layer right below the vicinity of an end part of the ridge) in the horizontal direction.

The results of FIGS. 13 and 14 show that ΔW is set at 2 μm to reduce ΔNhb as compared to that of the structure where ΔW is 0 μm (i.e., the structure of the first embodiment similar to the foregoing structure of the present embodiment in the resonator length, the tapered angle, and the average ridge-shaped stripe, except for ΔW).

Specifically, in the present embodiment, ΔNhb can be reduced to equal to or less than $2\times10^{18}$ cm$^{-3}$.

For the tapered stripe structure having an average ridge-shaped stripe width of 8 μm, a resonator length of 800 μm, and a tapered angle of 0.1°, FIGS. 15A to 15H show the carrier concentration distribution in a resonator direction in an active layer and the carrier concentration distribution in the horizontal direction on a front end side and a rear end side in the active layer in the cases of a ΔW of 0 μm, 1 μm, 2 μm, and 3 μm.

FIGS. 15A to 15H show that, in the case of a ΔW of 0 μm, the carrier concentration is maintained constant from the front end side to the rear end side in part of the active layer right below a center part of a ridge. However, FIGS. 15A to 15H also show that the carrier concentration in a front end part of the active layer right below the vicinity of an end part of the ridge is higher, and therefore occurrence of SHB in the horizontal direction is not completely reduced.

However, when ΔW is 2 μm, the carrier concentration in the active layer is substantially uniform both in the resonator direction and the horizontal direction. Since the maximum value of the carrier concentration with respect to the minimum value of the carrier concentration in part of the active layer right below a center part of the ridge is equal to or less than about $2\times10^{18}$ m$^{-3}$, the carrier concentration is reduced to about 20% of the carrier concentration in the case of a ΔW of 0 μm. Such a structure more effectively reduces carrier overflow which is leakage of electrons and holes, which are injected into the active layer, into a cladding layer, and further improves temperature characteristics. Thus, even in operation under a high temperature of equal to or higher than 60° C., watt-class ultra-high-power operation can be stably provided.

Figure 16A:
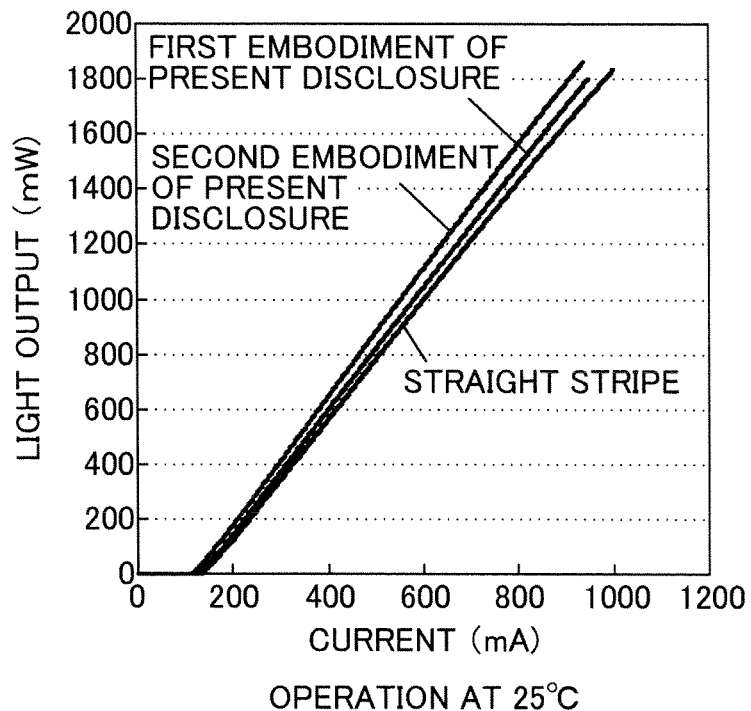
FIGS. 16A and 16B are graphs showing current-versus-light-output characteristics in the first and second embodiments and a comparative example.
Figure 16B:
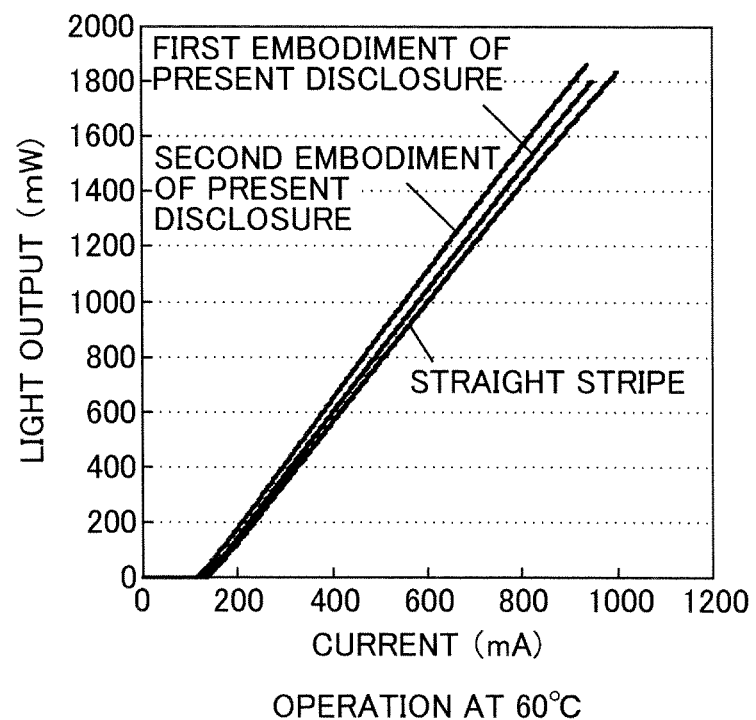

FIGS. 16A and 16B show the current-versus-light-output characteristics of the semiconductor light-emitting elements of the first and second embodiments at a temperature of 25° C. and 60° C.

The semiconductor light-emitting element of the first embodiment has the cross-sectional structure illustrated in FIG. 2, and has an average ridge-shaped stripe width of 8 μm, a resonator length of 800 μm, and a tapered angle θ of 0.1°. The semiconductor light-emitting element of the second embodiment has the cross-sectional structure illustrated in FIG. 10, and has an average ridge-shaped stripe width of 8 μm, a resonator length of 800 μm, a tapered angle θ of 0.1°, and a ΔW of 2 μm.

For the sake of comparison, each of FIGS. 16A and 16B additionally shows characteristics in the case (the case of a typical straight stripe structure) where the ridge-shaped stripe width is 8 μm, the tapered angle is 0°, and ΔW is 0 μm.

As will be seen from FIGS. 16A and 16B, the tapered stripe structure as in the first embodiment improves a slope efficiency by 1.03 times in high-temperature operation. Further, setting of ΔW at 2 μm as in the second embodiment improves the slope efficiency by 1.1 times.

Moreover, the current-versus-light-output characteristics show excellent linearity even in high-temperature operation, and do not have kinks degrading a light emitting efficiency. This is because of the following reason. Since the ridge-shaped stripe width Wr on the rear end side is 6.6 μm in both of the first and second embodiments, light can be guided in higher-order transverse modes than a fourth order transverse mode. Thus, even if the transverse modes are coupled together, the influence of the change in light distribution in the resonator direction is small, and the change in light emitting efficiency is small.

As just described, in the first and second embodiments, even if the tapered stripe structure is used, the light emitting efficiency and the temperature characteristics can be, as compared to the typical straight stripe structure, improved without degradation of the linearity of the current-versus-light-output characteristics.

Moreover, the tapered stripe shape of the present embodiment reduces occurrence of SHB not only in the resonator direction but also in the horizontal direction, and therefore the carrier concentration in the inner region of the active layer where light exists further becomes uniform.

In the typical straight stripe structure, a carrier concentration in an active layer is relatively higher on a rear end side than on a front end side. Thus, during high-power operation with an output of equal to or greater than one watt, growth of lattice defects in the high-carrier-concentration region of the active layer occurs, resulting in lowering of the long-term reliability of the semiconductor light-emitting element.

On the other hand, according to the tapered stripe structure of the present embodiment, in high-power operation with an output of equal to or greater than one watt, an operating current value is low, and self-heating of the semiconductor light-emitting element is reduced. Further, there is another advantage that the carrier concentration not only in the resonator direction but also in the horizontal direction is maintained constant. Thus, even with a short resonator length of equal to or longer than 550 μm and equal to or shorter than 1000 μm, growth of lattice defects in the active layer is reduced, and long-term reliability is improved.

Third Embodiment

In the first and second embodiments, the semiconductor light-emitting element capable of outputting laser light having a wavelength of 405 nm band has been described, but the present disclosure is not limited to a particular wavelength.

In the present embodiment, it will be described that a semiconductor light-emitting element capable of outputting laser light having a wavelength different from those of the foregoing embodiments provides the advantages similar to those of the foregoing embodiments.

Figure 17:
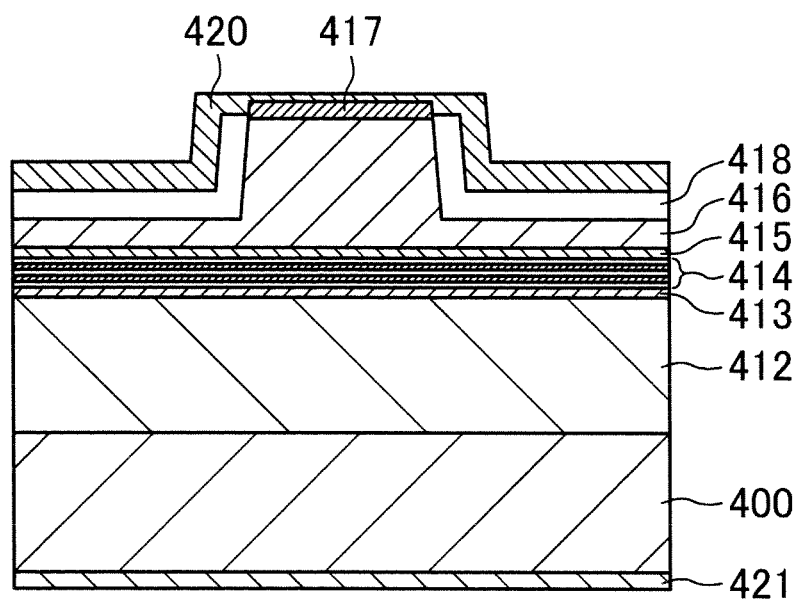
FIG. 17 is a cross-sectional view of a semiconductor light-emitting element of a third embodiment of the present disclosure.

A cross-sectional structure of a semiconductor light-emitting element of a third embodiment of the present disclosure is illustrated in FIG. 17.

FIG. 17 is a cross-sectional view of a semiconductor laser configured such that an n-type AlGaN cladding layer 412 (a film thickness of 2.5 μm), an n-type AlGaN guide layer 413 (860 Å (86 nm)), a multiple quantum well active layer 414 made of an InGaN-based material, a p-type quantum well electronic barrier layer 415, a p-type AlGaN cladding layer 416, a p-type GaN contact layer 417 (a film thickness of 0.1 μm), a current block layer 418 transparent to light, a p-type electrode 420, and an n-type electrode 421 are stacked on a GaN substrate 400. A ridge-shaped stripe forms a waveguide at the p-type AlGaN cladding layer 416, and an average ridge-shaped stripe width (W) is 15.0 μm. Note that the order of stacking the n-type and p-type layers is not limited to the foregoing, and the positions of the n-type and p-type layers may be switched.

In this state, the distance between an upper end part of the ridge of the p-type AlGaN cladding layer 416 and the active layer 414 is 0.5 μm, and the distance between a lower end part of the ridge of the p-type AlGaN cladding layer 416 and the active layer 414 is indicated by "dp" (0.2 μm).

In the third embodiment, an Al composition in the n-type AlGaN cladding layer 412 and the p-type AlGaN cladding layer 416 is 0.07 in order to confine light in the vertical direction in the active layer. An increase in Al composition in the n-type AlGaN cladding layer 412 and the p-type AlGaN cladding layer 416 results in a greater refractive index difference between the active layer and the cladding layer. Thus, it can ensured that light is confined in the vertical direction in the active layer, and therefore a lasing threshold current can be decreased.

However, due to the difference in thermal expansion coefficient between the AlGaN layer and the GaN substrate, an extremely-great Al composition in the AlGaN cladding layer leads to lattice defects, resulting in lowering of reliability. For such a reason, the semiconductor light-emitting element is preferably manufactured such that the Al composition in the AlGaN cladding layer is equal to or less than 0.2.

In order to output laser light having a wavelength of 445 nm band, the multiple quantum well active layer 414 of the third embodiment has a DQW structure of two InGaN well layers each having a thickness of 30 Å (3 nm) and having an In composition of 0.12.

In order to output laser light having a wavelength of 445 nm band, it is preferable that an atomic composition xw of In satisfies $0.1 \leq xw \leq 0.15$, where an atomic composition in the well layer of the quantum well active layer is $In_{xw}Ga_{yw}Al_{1-xw-yw}N$, and that the thickness of each well layer is equal to or greater than 20 Å (2 nm) and equal to or less than 50 Å (5 nm).

When the thickness of each well layer exceeds 50 Å (5 nm) within the foregoing atomic composition range, strain energy stored inside the well layer increases, and therefore the atomic composition in the well layer becomes non-uniform. As a result, a light-emitting efficiency is lowered. Reasons for the foregoing will be described below.

Suppose that a nitride mixed crystal semiconductor is made of InN, AlN, and GaN. The lattice mismatch between InN and GaN, the lattice mismatch between InN and AlN, and the lattice mismatch between GaN and AlN are 11.3%, 13.9%, and 2.3%, respectively. In this case, the distance between atoms is different among InN, GaN, and AlN. Thus, even if an atomic composition is set such that, e.g., the lattice constant of the InGaAlN layer is equal to that of GaN, the distance between atoms forming the InGaAlN layer and the bond angle between the atoms forming the InGaAlN layer are different from an ideal distance and an ideal bond angle in the case of a binary compound semiconductor. Thus, strain energy is stored inside the InGaAlN layer. In order to reduce such internal strain energy, phase separation occurs, which is the state in which there are regions different in atomic composition from each other in the InGaAlN layer.

In this case, In atoms, Ga atoms, and Al atoms are non-uniformly distributed across the InGaAlN layer. Thus, bandgap energy distribution and refractive index distribution in the layer where phase separation occurs become non-uniform. The non-uniform composition region where phase separation occurs mainly acts to absorb light, or causes scattering of guided light. When phase separation occurs, the operating current of the semiconductor laser increases, resulting in a shorter life of the semiconductor laser.

The difference in lattice constant between GaN and AlN is small, and the difference in lattice constant between InN and GaN and the difference in lattice constant between InN and AlN are large. Thus, strain energy inside the InGaAlN layer is most susceptible to the atomic composition xw of In. When the In composition xw in the InGaAlN well layer is 0.15, if the thickness of each well layer exceeds 50 Å (5 nm), strain energy stored inside the well layer increases, resulting in phase separation and lattice defects. Accordingly, the light-emitting efficiency of the semiconductor light-emitting element is lowered.

When the In composition xw in the InGaAlN well layer is equal to or less than 0.1, the bandgap energy of the well layer itself becomes higher than energy corresponding to a wavelength of 445 nm. As a result, laser light is output with a wavelength shorter than 445 nm.

Thus, in order to output laser light having a wavelength of 445 nm band, as long as the atomic composition xw of In in the $In_{xw}Ga_{yw}Al_{1-xw-yw}N$ well layer satisfies $0.1 \leq xw \leq 0.15$ and the thickness of each well layer is equal to or less than 50 Å (5 nm), occurrence of phase separation and lattice defects can be reduced.

In addition, since an extremely-small thickness of each well layer results in a greater carrier concentration in the well layer, current leakage increases, and therefore temperature characteristics are degraded. For such a reason, the thickness of each well layer is preferably at least 20 Å (2 nm).

When a thin well layer is used, strain energy stored inside the well layer decreases. This can reduce occurrence of phase separation and lattice defects, but current leakage increases as described above. Thus, when a plurality of thin well layers are used, a carrier concentration decreases, and therefore occurrence of current leakage can be reduced.

However, if the total thickness of the well layers of a multiple quantum well active layer is too large, strain energy stored inside the entirety of the multiple quantum well active layer increases, resulting in lattice defects. For such a reason, in order to reduce occurrence of lattice defects and phase separation and to reduce current leakage, the total thickness of the well layers is preferably equal to or greater than 40 Å (4 nm) and equal to or less than 100 Å (10 nm).

The InGaAlN well layer formed such that the In composition and thickness thereof fall within the foregoing ranges can provide a semiconductor light-emitting element having a high power conversion efficiency and capable of outputting light having a wavelength of 445 nm band.

The current block layer 418 (0.1 µm) which is a dielectric made of SiN is formed on a side face of the ridge of the p-type AlGaN cladding layer 416. In this structure, current is injected from the p-type GaN contact layer 417 so as to concentrate into the ridge of the p-type AlGaN cladding layer 416 through an opening of the current block layer 418, and then is intensively injected into part of the active layer 414 positioned below a bottom part of the ridge of the p-type AlGaN cladding layer 416. As a result, carrier population inversion required for lasing is provided by a current injection of about a hundred milliamperes.

Light emitted, in the foregoing state, by recombination of carriers injected into the active layer is confined in the direction perpendicular to the active layer by the cladding layers 412, 416. Since the current block layer 418 has a lower refractive index than that of the cladding layer, the light is confined in the direction parallel to the active layer, i.e., the horizontal direction. Moreover, since the current block layer 418 is transparent to laser light, the current block layer 418 absorbs no light, and a low-loss waveguide can be provided.

Since the distribution of light propagating through the waveguide can greatly expand to the current block layer, $\Delta N$ in the order of $10^{-3}$, which is suitable for high-power operation, can be easily provided. Further, the magnitude of $\Delta N$ can be precisely controlled in the order of $10^{-3}$ depending on the distance (dp) between the current block layer 418 and the active layer. Thus, while light distribution can be precisely controlled, a high-power semiconductor laser can be provided with low operating current. In the third embodiment, light is confined in the horizontal direction with a value $\Delta N$ of $1.5 \times 10^{-3}$.

Figure 18:
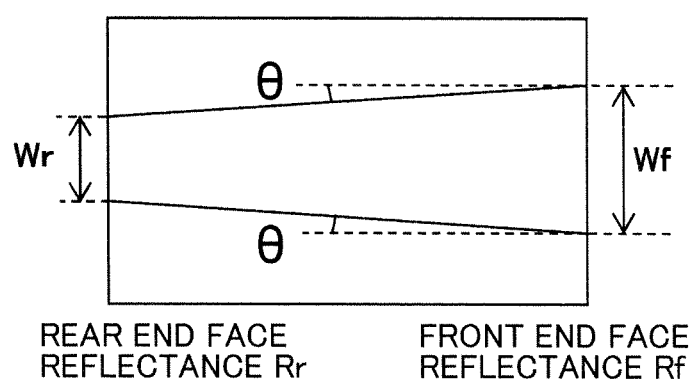
FIG. 18 is a view of a ridge-shaped stripe structure of the semiconductor light-emitting element of the third embodiment.

Next, FIG. 18 illustrates the shape of the ridge-shaped stripe of the semiconductor light-emitting element of the third embodiment in a resonator direction. Referring to FIG. 18, a front end side ridge-shaped stripe width (Wf) is greater than a rear end side ridge-shaped stripe width (Wr). That is, the ridge-shaped stripe is in such a tapered shape that Wf>Wr is satisfied. A low-reflectance coating having a reflectance Rf of 6% is formed on a front resonator end in order to improve a light extraction efficiency, and a high-reflectance coating having a reflectance Rr of 95% is formed on a rear resonator end. The reflectance value is not limited to the foregoing as long as Rf<Rr is satisfied.

The inclination angle of the ridge-shaped stripe to the resonator direction is represented by "$\theta$." In order to provide high light output even in high-temperature operation, light not only in a fundamental transverse mode but also in at least high-order transverse modes up to a third order transverse mode can be preferably guided in the waveguide as described in the first embodiment. Further, in order to reduce occurrence of SHB, the tapered angle may be equal to or higher than 0.05° and equal to or lower than 0.15°, and preferably 0.1°. In the semiconductor light-emitting element of the present embodiment, the tapered angle $\theta$ is set at 0.1° to reduce occurrence of SHB in the resonator direction.

Since Wr is set at such a value that light in the higher-order transverse modes than the third order transverse mode can be guided, laser light in transverse modes whose orders are different from each other is simultaneously output. Thus, even if electric fields of light in the transverse modes are coupled together, the number of the order of transverse modes is four, i.e., the zero to third orders, and therefore the influence of the change in light distribution in the resonator direction is reduced.

Thus, the influence of kinks degrading the linearity of current-versus-light-output characteristics is small, and lowering of a thermal saturation level due to the kinks is reduced. As a result, in the third embodiment, the influence of thermal saturation is small even in high-temperature operation with an output of equal to or greater than one watt at a temperature of 60°, resulting in the current-versus-light-output characteristics showing excellent linearity.

Next, the relationship between the tapered angle $\theta$ and occurrence of SHB in the resonator direction will be described with reference to carrier concentration distribution in the active layer of the semiconductor light-emitting element of the third embodiment during operation.

Figure 19A:
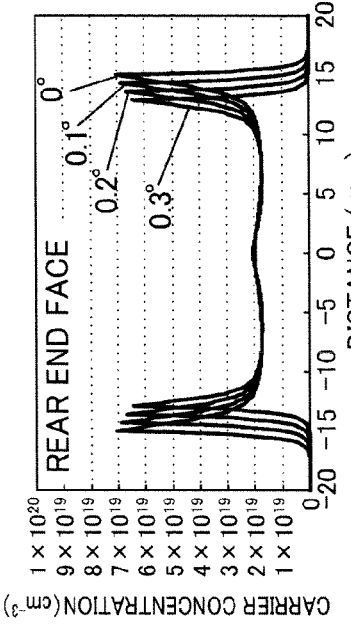
FIGS. 19A to 19D are graphs showing carrier concentration distribution in the horizontal direction depending on tapered angles in the semiconductor light-emitting element of the third embodiment.
Figure 19C:
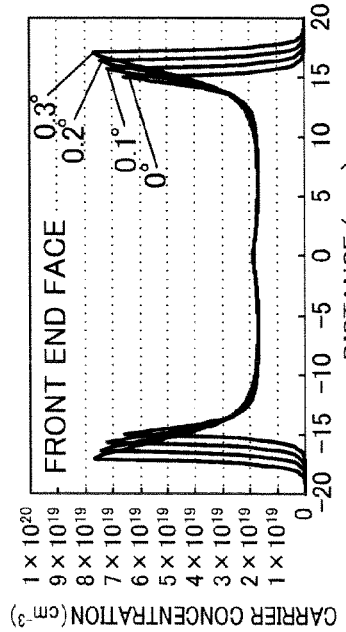
Figure 19B:
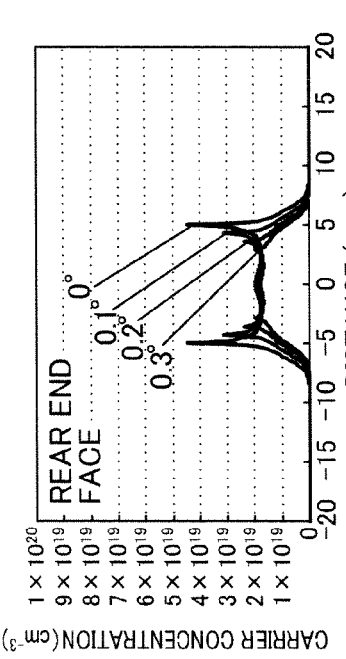
Figure 19D:
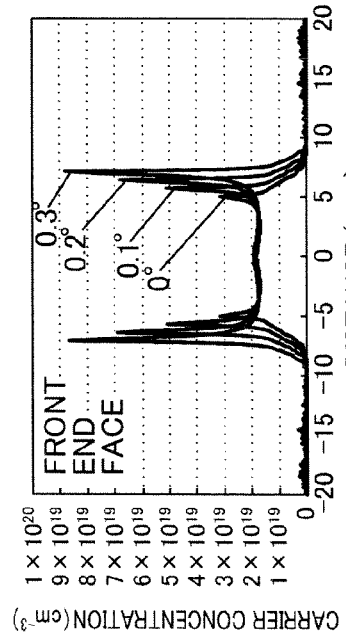

FIGS. 19A to 19D show carrier concentration distribution in a front end part and a rear end part of an active layer in one-watt operation. FIGS. 19A to 19D are similar to each other in that the resonator length is 800 µm, but are different from each other in tapered shape (tapered angle $\theta$ provided within a range of 0° to 0.3°). FIGS. 19A and 19B show the carrier concentration distribution in the case of the tapered shapes having an average ridge-shaped stripe width of 10 µm, and FIGS. 19C and 19D show the carrier concentration distribution in the case of the tapered shapes having an average ridge-shaped stripe width of 30 µm. Moreover, FIGS. 19A and 19C show the carrier concentration distribution on the rear end side, and FIGS. 19B and 19D show the carrier concentration distribution on the front end side.

Figure 20A:
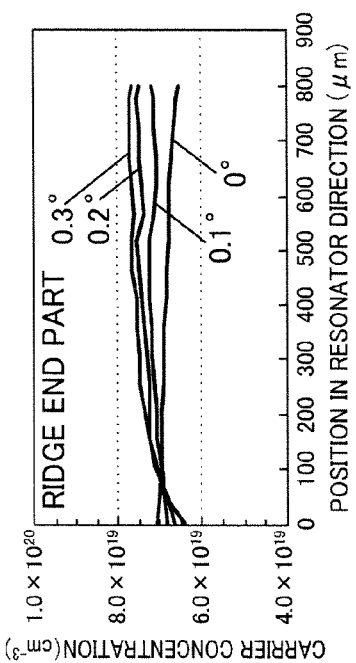
FIGS. 20A to 20D are graphs showing carrier concentration distribution in a resonator direction depending on tapered angles in the semiconductor light-emitting element of the third embodiment.
Figure 20B:
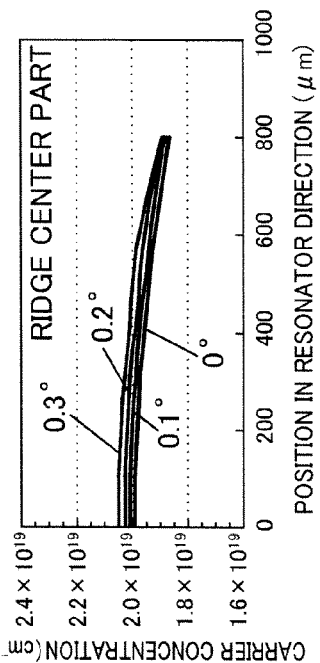
Figure 20C:
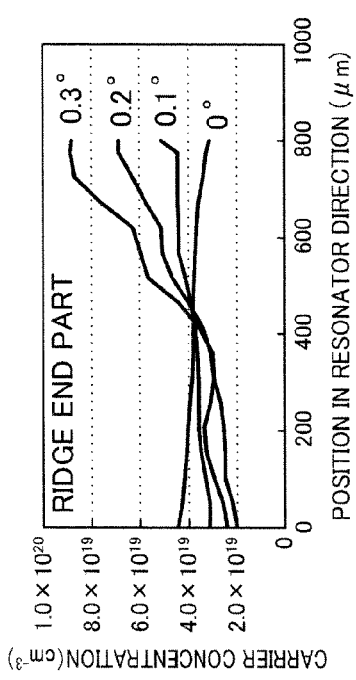
Figure 20D:
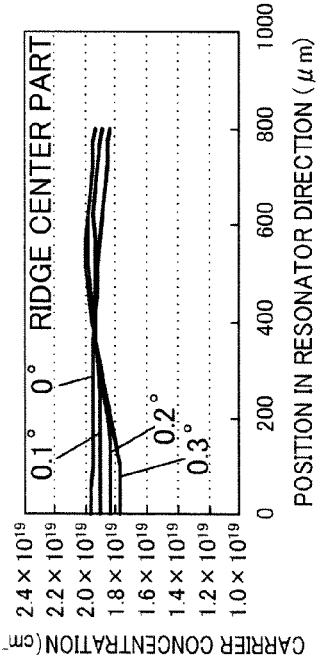

FIGS. 20A to 20D each show the change in carrier concentration in part of an active layer right below a center part of a ridge in the resonator direction in one-watt operation, or the change in carrier concentration in part (part of the active layer right below an end part of the ridge) of the active layer where the carrier concentration shown in FIGS. 19A to 19D is the maximum in the resonator direction in one-watt operation. FIGS. 20A to 20D are similar to each other in that the resonator length is 800 µm, but are different from each other in tapered shape (tapered angle $\theta$ provided within a range of 0° to 0.3°). FIGS. 20A and 20B show the change in carrier concentration in the case of the tapered shapes having an average ridge-shaped stripe width of 10 µm, and FIGS. 20C and 20D show the change in carrier concentration in the case of the tapered shapes having an average ridge-shaped stripe width of 30 µm. Moreover, FIGS. 20A and 20C show the change in carrier concentration in the ridge end part, and FIGS. 20B and 20D show the change in carrier concentration in the ridge center part.

Figure 21A:
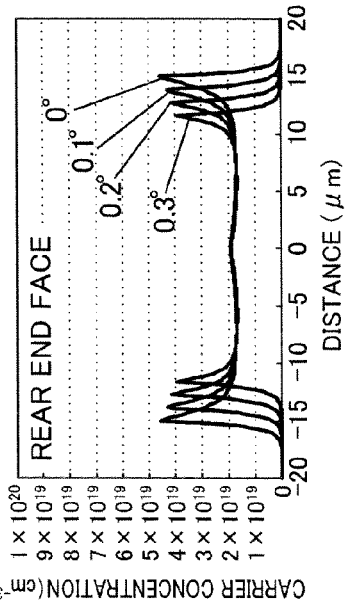
FIGS. 21A to 21D are graphs showing carrier concentration distribution in the horizontal direction depending on tapered angles in the semiconductor light-emitting element of the third embodiment.
Figure 21B:
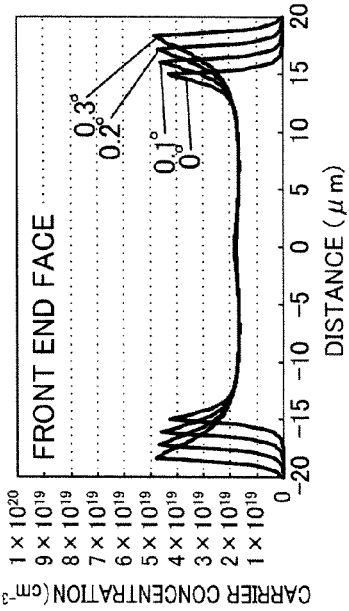
Figure 21C:
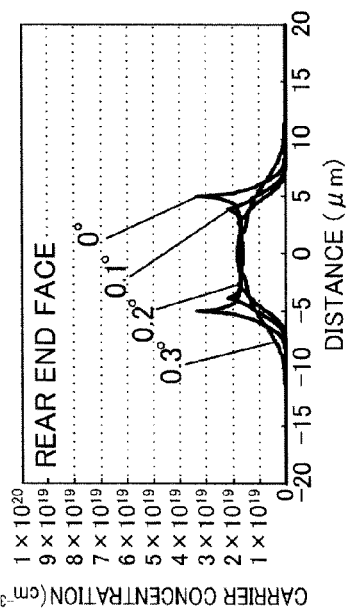
Figure 21D:
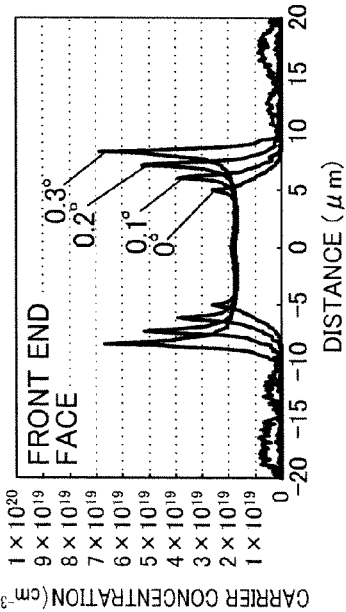

Next, FIGS. 21A to 21D show carrier concentration distribution in a front end part and a rear end part of an active layer in one-watt operation. FIGS. 21A to 21D are similar to each other in that the resonator length is 1300 µm, but are different from each other in tapered shape (tapered angle $\theta$ provided within a range of 0° to 0.3°). FIGS. 21A and 21B show the carrier concentration distribution in the case of the tapered shapes having an average ridge-shaped stripe width of 10 µm, and FIGS. 21C and 21D show the carrier concentration distribution in the case of the tapered shapes having an average ridge-shaped stripe width of 30 µm. Moreover, FIGS. 21A and 21C show the carrier concentration distribution on the rear end side, and FIGS. 21B and 21D show the carrier concentration distribution on the front end side.

Figure 22A:
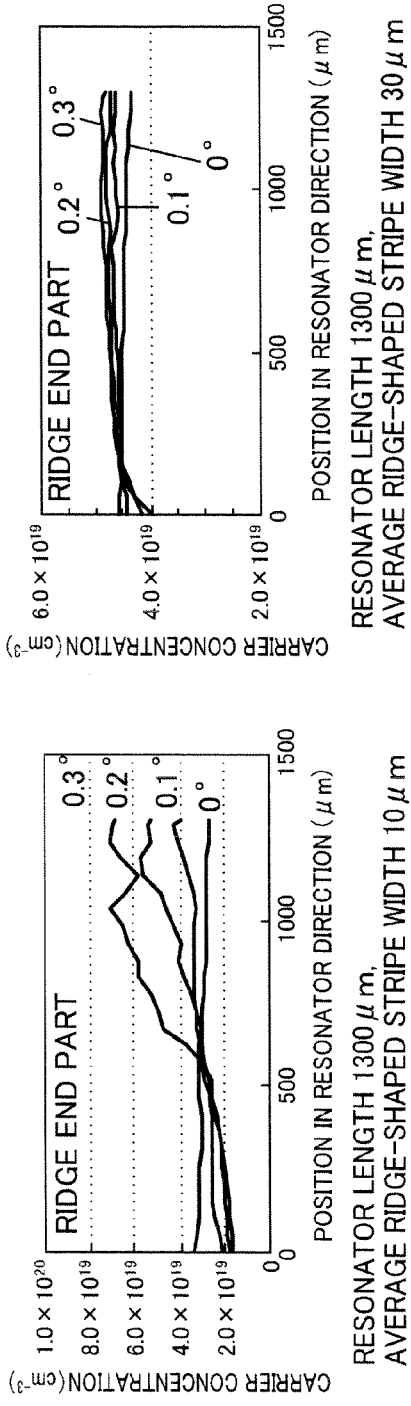
FIGS. 22A to 22D are graphs showing carrier concentration distribution in the resonator direction depending on tapered angles in the semiconductor light-emitting element of the third embodiment.
Figure 22C:
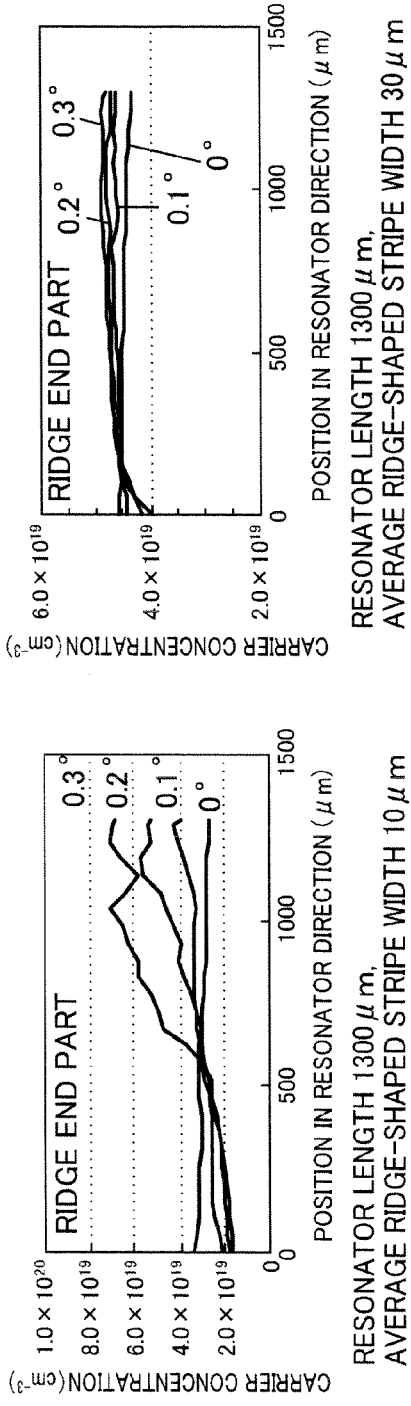
Figure 22B:
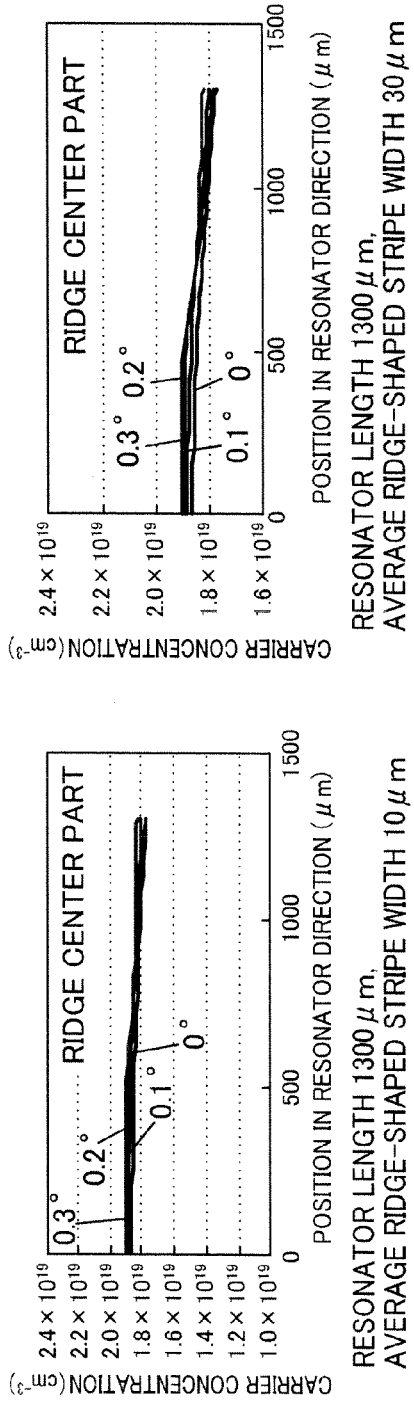
Figure 22D:
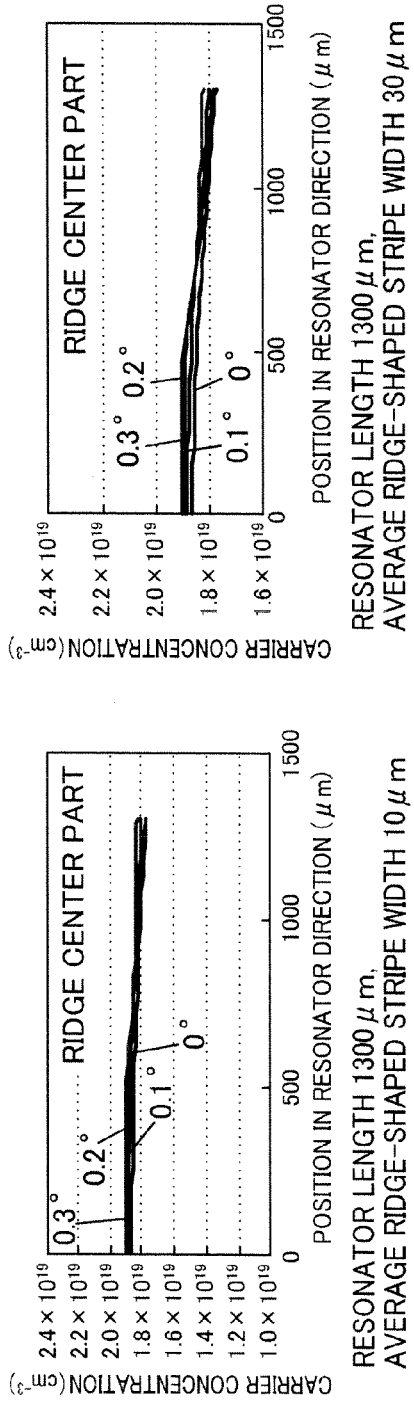

FIGS. 22A to 22D each show the change in carrier concentration in part of an active layer right below a center part of a ridge in a resonator direction in one-watt operation, or the change in carrier concentration in part (part of the active layer right below the vicinity of an end part of the ridge) of the active layer where the carrier concentration shown in FIGS. 21A to 21D is the maximum in the resonator direction in one-watt operation. FIGS. 22A to 22D are similar to each other in that the resonator length is 1300 μm, but are different from each other in tapered shape (tapered angle θ provided within a range of 0° to 0.3°). FIGS. 22A and 22B show the change in carrier concentration in the case of the tapered shapes having an average ridge-shaped stripe width of 10 μm, and FIGS. 22C and 22D show the change in carrier concentration in the case of the tapered shapes having an average ridge-shaped stripe width of 30 μm. Moreover, FIGS. 22A and 22C show the change in carrier concentration in the ridge end part, and FIGS. 22B and 22D show the change in carrier concentration in the ridge center part.

Referring to FIGS. 19 to 22, in any of the stripe structures, the difference in carrier concentration in the active layer during operation is small in the case of a tapered angle of 0.1°. That is, in such a case, occurrence of SHB is most reduced. This shows that, in the semiconductor laser capable of outputting laser light having a wavelength of 445 nm band, occurrence of SHB is reduced in such a manner that the tapered angle is set at a preferable angle of 0.05° to 0.15° or a more preferable angle of 0.1° in the ridge-shaped stripe of the semiconductor laser in which the average ridge-shaped stripe falls within a range of 10 to 30 μm and the resonator length falls within a range of 800 to 1300 μm. Thus, by setting the tapered angle θ at a preferable angle of 0.05° to 0.15° or a more preferable angle of 0.1° in the ridge-shaped stripe of the semiconductor laser in which the average ridge-shaped stripe falls within a range of 10 to 30 um and the resonator length falls within a range of 800 to 1300 μm, a high-power laser having excellent temperature characteristics and exhibiting a high thermal saturation level can be provided.

The tendency shows that a greater ridge-shaped stripe width results in greater occurrence of SHB in the horizontal direction. In order to further reduce occurrence of SHB in the horizontal direction, the average ridge-shaped stripe width is preferably equal to or greater than 10 μm and equal to or less than 20 μm in the foregoing structure.

The tapered stripe shape described above reduces occurrence of SHB in the resonator direction, and provides a uniform carrier concentration.

In the case of a conventional straight stripe structure, a carrier concentration in an active layer is relatively higher on a rear end side than on a front end side. Due to such a state, growth of lattice defects in the high-carrier-concentration region of the active layer occurs, resulting in lowering of the long-term reliability of a semiconductor light-emitting element.

On the other hand, according to the tapered stripe structure of the present embodiment, even in high-power operation with an output of equal to or greater than one watt, the operating current value is low, and self-heating of the semiconductor light-emitting element is reduced. Further, there is another advantage that the carrier concentration in the resonator direction is maintained constant. Thus, even with a short resonator length of equal to or longer than 800 μm and equal to or shorter than 1300 μm, growth of lattice defects in the active layer is reduced, and long-term reliability is improved.

Fourth Embodiment

In the third embodiment, it has been described that the tapered angle is set at an angle of 0.05° to 0.15° or a preferable angle of 0.1° to reduce occurrence of SHB. However, even with such a tapered angle range, the carrier concentration in part of the active layer right below the vicinity of the end part of the ridge is higher than that in part of the active layer right below the center part of the ridge. This shows that occurrence of SHB in the horizontal direction is not completely reduced.

For such a reason, in a fourth embodiment, the structure for more effectively reducing occurrence of SHB and further improving temperature characteristics will be described.

Figure 23:
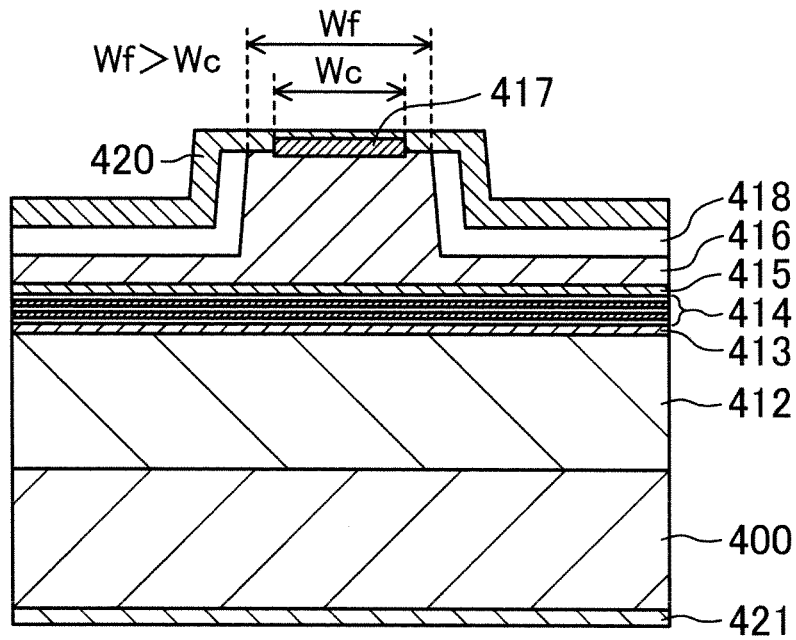
FIG. 23 is a cross-sectional view of a semiconductor light-emitting element of a fourth embodiment of the present disclosure.

FIG. 23 is a cross-sectional view of a semiconductor light-emitting element of the fourth embodiment of the present disclosure. Such a structure is different from the cross-sectional structure (see FIG. 17) of the semiconductor light-emitting element of the third embodiment in the width (the width of a front end part is represented by "Wc") of a p-type GaN contact layer 417 formed on a p-type AlGaN cladding layer 416. In the semiconductor light-emitting element of the fourth embodiment, Wf>Wc is satisfied, where the width of a front end side top part of a ridge formed at the p-type AlGaN cladding layer 416 is represented by "Wf."

Figure 24:
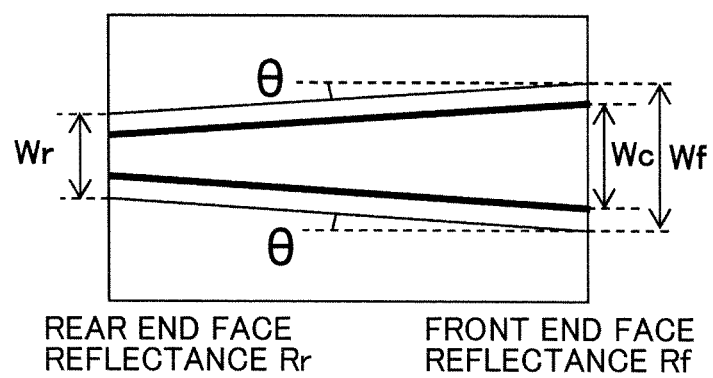
FIG. 24 is a view of a ridge-shaped stripe structure of the semiconductor light-emitting element of the fourth embodiment.

FIG. 24 illustrates the shape of a ridge-shaped stripe of the semiconductor light-emitting element of the fourth embodiment in a resonator direction. Referring to FIG. 24, the ridge-shaped stripe is in such a tapered shape that the front end side ridge-shaped stripe width (Wf) is greater than a rear end side ridge-shaped stripe width (Wr). Moreover, the width of the p-type GaN contact layer 417 is, at any positions in the resonator direction, smaller than that of a top part of the ridge-shaped stripe formed at the p-type AlGaN cladding layer 416 by ΔW (=Wf−Wc). A low-reflectance coating having a reflectance of 6% is formed on a front resonator end in order to improve a light extraction efficiency, and a high-reflectance coating having a reflectance of 95% is formed on a rear resonator end. This is similar to the semiconductor light-emitting element of the third embodiment.

For the stripe shapes each having an average ridge-shaped stripe width (the average of the width of the top part of the ridge-shaped stripe formed at the p-type AlGaN cladding layer 416) of 10 μm, 20 μm, or 30 μm and having a resonator length of 1300 μm or 800 μm, the degree of SHB, i.e., variation in carrier concentration, in an active layer during one-watt operation in the foregoing structure was obtained by calculation of ΔNhb.

The difference between the maximum value of the carrier concentration in the active layer and the minimum value of the carrier concentration in part of the active layer right below the center part of the ridge is represented by "ΔNhb." In the case of a small ΔNhb, the carrier concentration in the active layer is substantially uniform, and therefore it is assumed that occurrence of SHB in the active layer is reduced.

Figure 25A:
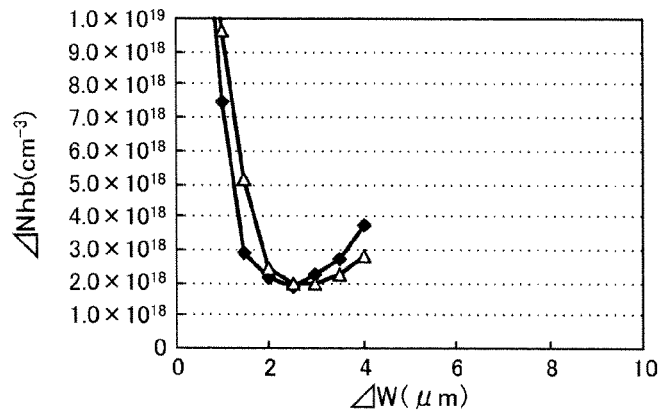
FIGS. 25A to 25C are graphs showing the ΔW dependency of occurrence of SHB of carriers in the semiconductor light-emitting element of the fourth embodiment.
Figure 25B:
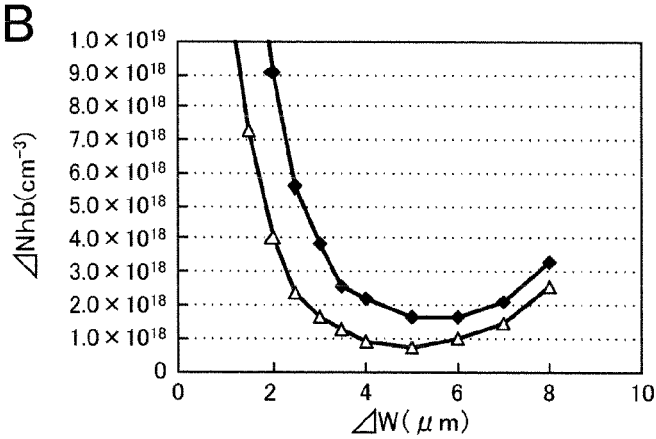
Figure 25C:
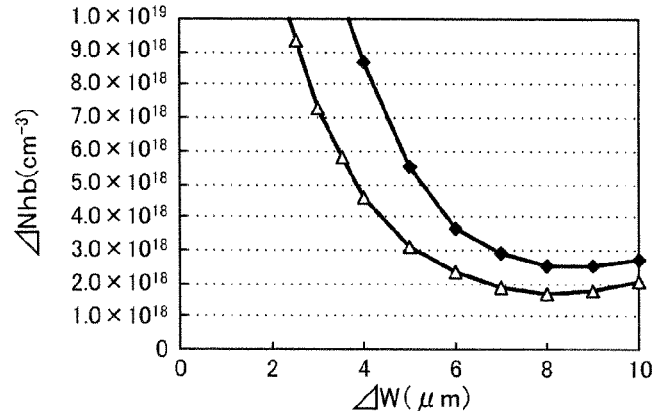
Figure 26A:
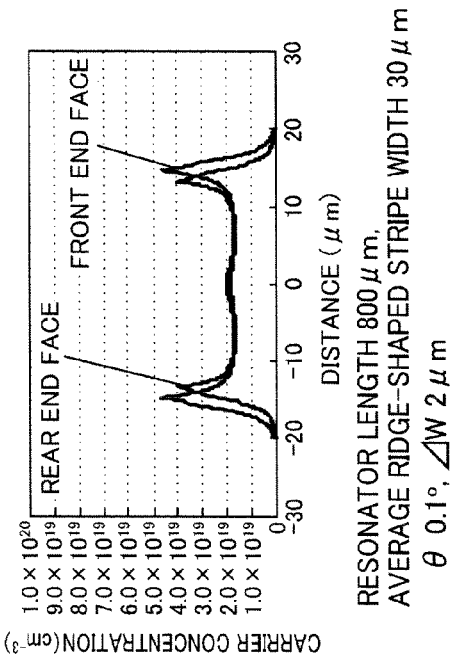
FIGS. 26A to 26D are graphs showing carrier concentration distribution in the horizontal direction in the semiconductor light-emitting element of the fourth embodiment.
Figure 26C:
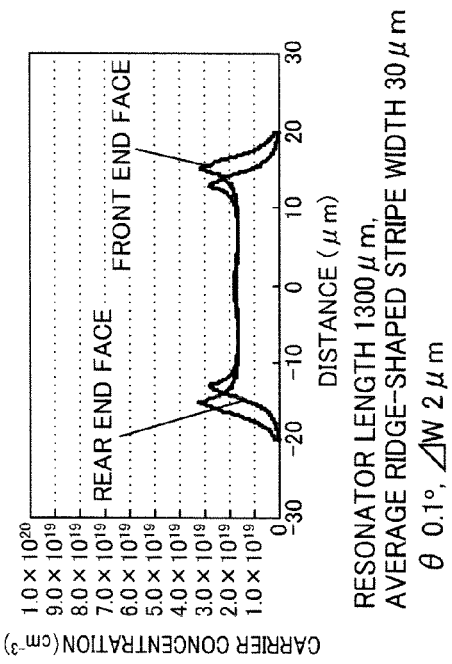
Figure 26B:
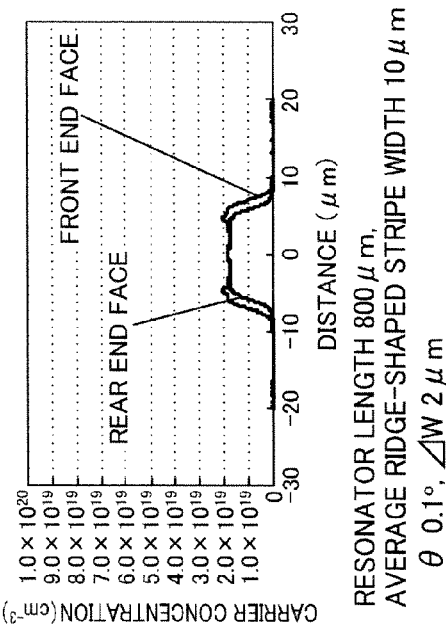
Figure 26D:
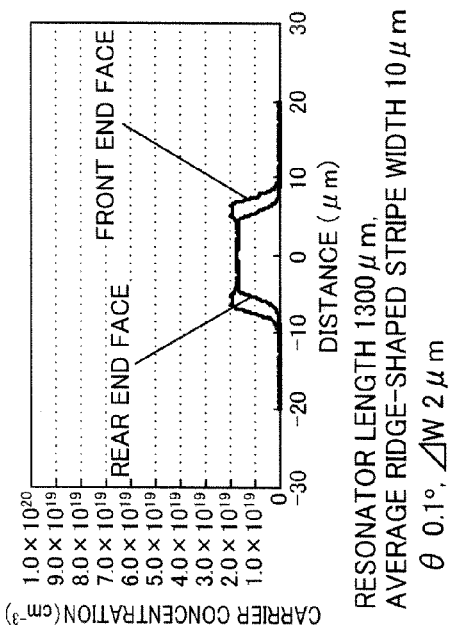
Figure 27A:
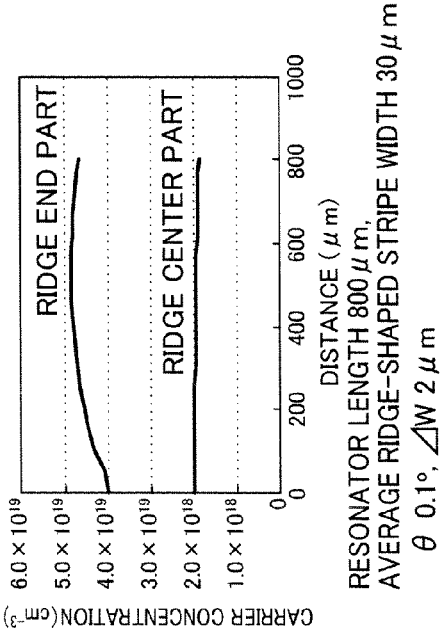
FIGS. 27A to 27D are graphs showing carrier concentration distribution in a resonator direction in the semiconductor light-emitting element of the fourth embodiment.
Figure 27C:
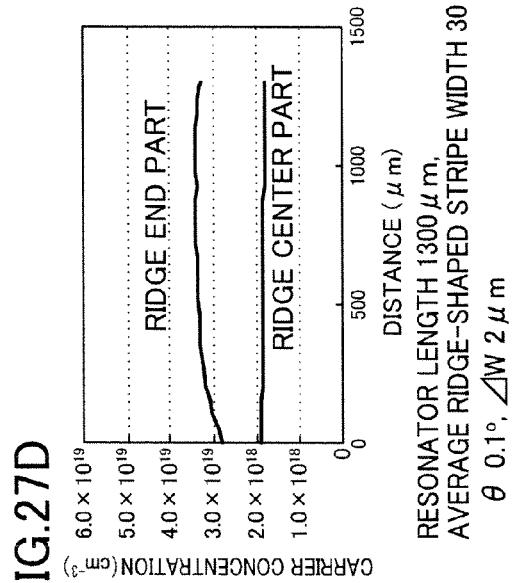
Figure 27B:
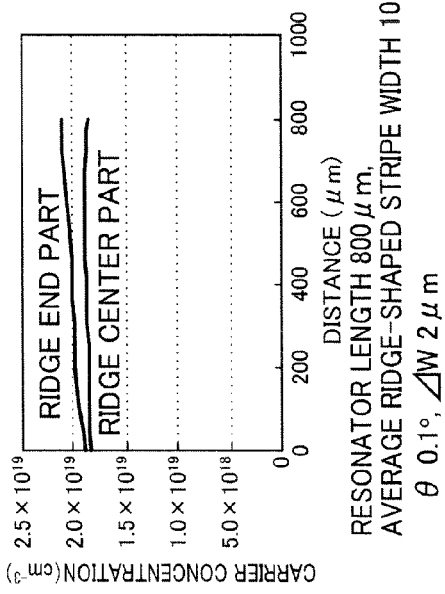
Figure 27D:
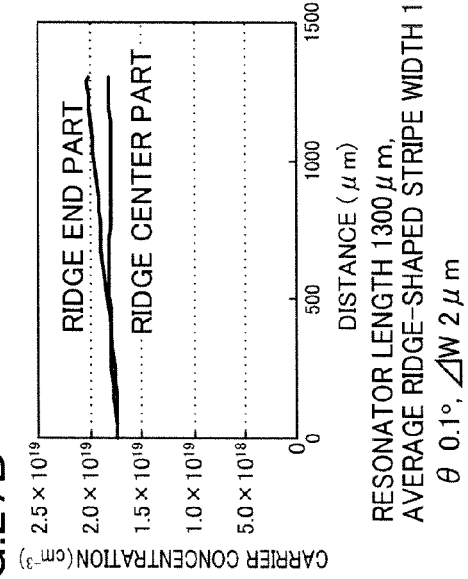

FIGS. 25A to 25C show ΔW dependency of ΔNhb in the foregoing stripe shapes.

FIG. 25A shows that, in the case of an average ridge-shaped stripe width of 10 μm, ΔNhb decreases within a ΔW range of 1.0 to 4 μm, reaches the minimum value at a ΔW of around 3 μm, and then gradually increases with increasing ΔW.

Moreover, FIG. 25B shows that, in the case of an average ridge-shaped stripe width of 20 μm, ΔNhb decreases within a ΔW range of 2.0 to 8 μm, reaches the minimum value at a ΔW of around 5 μm, and then gradually increases with increasing ΔW.

Further, FIG. 25C shows that, in the case of an average ridge-shaped stripe width of 30 μm, ΔNhb decreases within a ΔW range of 3 to 10 μm, reaches the minimum value at a ΔW of around 8 μm, and then gradually increases with increasing ΔW.

When the average ridge-shaped stripe width falls within a range of 10 to 30 μm, if ΔW is equal to or greater than 1 μm, the degree of SHB is reduced as compared to the case of a ΔW of 0 µm. If ΔW is equal to or greater than 2 µm, the degree of SHB is further reduced as compared to the case of a ΔW of 0 µm.

When the average ridge-shaped stripe width is $W_{ave}$ (µm), if the magnitude of ΔW (µm) is $(W_{ave}/4+0.33)$ µm, ΔNhb is at the minimum value. When the resonator length is within a range of 800 to 1300 µm, and the average ridge-shaped stripe width is within a range of 10 to 30 µm, if ΔW is set within a preferable range of $((W_{ave}/4+0.33)\pm 2)$ µm or a more preferable range of $((W_{ave}/4+0.33)\pm 1)$ µm, ΔNhb can be reduced.

An extremely-large AW results in an increase in series resistance of the semiconductor light-emitting element. This leads to an increase in operating current and therefore to an increase in self-heating of the semiconductor light-emitting element during operation. An increase in self-heating of the semiconductor light-emitting element results in a decrease in thermal saturation level. This leads to a decrease in thermal saturation level in high-temperature high-power operation with an output of equal to or greater than one watt at a temperature of equal to or higher than 60° C. Thus, when ΔW is preferably set at equal to or greater than 1 µm and equal to or less than $((W_{ave}/4+0.33)+2)$ µm and more preferably equal to or greater than 2 µm and equal to or less than $((W_{ave}/4+0.33)+1)$ µm, temperature characteristics can be improved without a significant increase in operating current.

For the tapered shapes each having a resonator length of 800 or 1300 µm, having an average ridge-shaped stripe width of 10 or 30 µm, having a tapered angle θ of 0.1°, and having a ΔW of 2 µm, FIGS. 26A to 26D show carrier concentration distribution on a front end side and a rear end side in an active layer.

For the tapered shapes each having a resonator length of 800 µm or 1300 µm, having an average ridge-shaped stripe width of 10 µm or 30 µm, having a tapered angle θ of 0.1°, and having a ΔW of 2 µm, FIGS. 27A to 27D show a carrier concentration in part of an active layer right below a center part of a ridge and the resonator-direction dependency of the maximum value of the carrier concentration (carrier concentration in part of the active layer right below the vicinity of an end part of the ridge) in the horizontal direction.

The results of FIGS. 26 and 27 show that ΔW is set at 2 µm to reduce ΔNhb to a value of equal to or less than about 60% of ΔNhb of the structure where ΔW is 0 µm (i.e., the structure of the third embodiment similar to the foregoing structure of the present embodiment in the resonator length, the tapered angle, and the average ridge-shaped stripe, except for ΔW). Such a state can be also provided in the case where the average ridge-shaped stripe width is a large value of 30 µm, i.e., the case where SHB is relatively likely to occur. In the case where the average ridge-shaped stripe width is a small value of 10 µm, ΔNhb can be reduced to a value of equal to or less than the half of ΔNhb of the structure where ΔW is 0 µm.

The tendency shows that a greater ridge-shaped stripe width results in greater occurrence of SHB in the horizontal direction. In order to further reduce occurrence of SHB in the horizontal direction, the average ridge-shaped stripe width is more preferably equal to or greater than 10 µm and equal to or less than 20 µm in the foregoing structure.

Figure 28A:
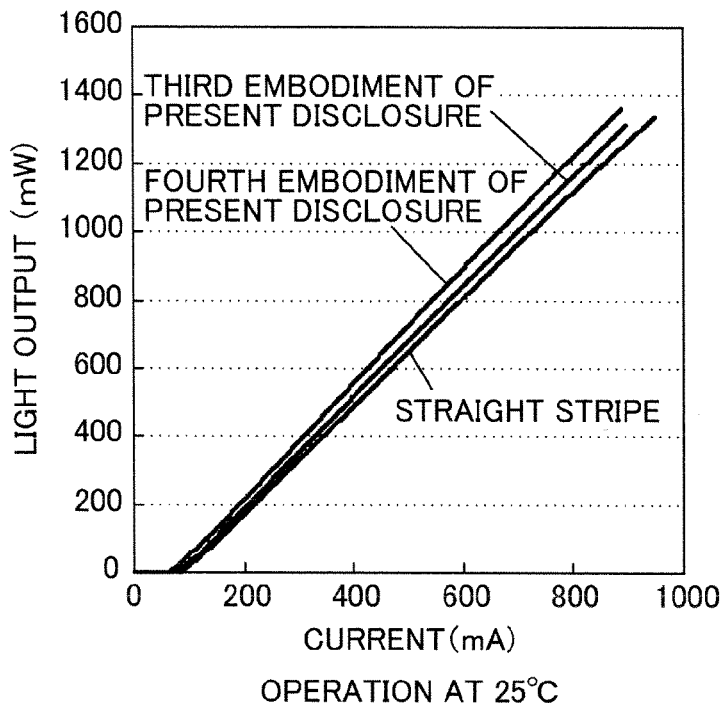
FIGS. 28A and 28B are graphs showing current-versus-light-output characteristics in the third and fourth embodiments and a comparative example.
Figure 28B:
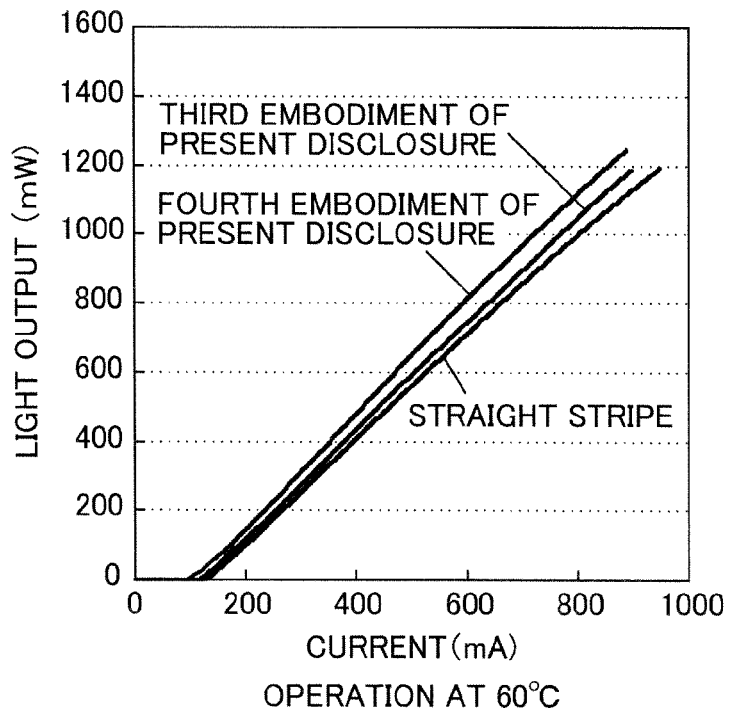

FIGS. 28A and 28B show the current-versus-light-output characteristics of the semiconductor light-emitting elements of the third and fourth embodiments at a temperature of 25° C. and 60° C.

The semiconductor light-emitting element of the third embodiment has the cross-sectional structure illustrated in FIG. 17, and has an average ridge-shaped stripe width of 15 µm, a resonator length of 1200 µm, and a tapered angle θ of 0.1°. The semiconductor light-emitting element of the fourth embodiment has the cross-sectional structure illustrated in FIG. 23, and has an average ridge-shaped stripe width of 8 µm, a resonator length of 800 µm, a tapered angle θ of 0.1°, and a ΔW of 2 µm.

For the sake of comparison, each of FIGS. 28A and 28B additionally shows characteristics in the case (the case of a typical straight stripe structure) where the ridge-shaped stripe width is 15 µm, the tapered angle is 0°, and ΔW is 0 µm.

As will be seen from FIGS. 28A and 28B, the tapered stripe structure as in the third embodiment improves a slope efficiency in high-temperature operation by 1.03 times as in the characteristics shown in FIGS. 16A and 16B. Further, setting of ΔW at 2 µm as in the fourth embodiment improves the slope efficiency by 1.1 times.

Moreover, the current-versus-light-output characteristics show excellent linearity even in high-temperature operation, and do not have kinks degrading a light emitting efficiency. This is because of the following reason. Since the ridge-shaped stripe width Wr on the rear end side is 12.9 µm in both of the third and fourth embodiments, light can be guided in higher-order transverse modes than a fourth order transverse mode. Thus, even if the transverse modes are coupled together, the influence of the change in light distribution in the resonator direction is small, and the change in light emitting efficiency is small.

As just described, in the third and fourth embodiments, the tapered stripe structure can be used to improve, as compared to the typical straight stripe structure, the light emitting efficiency and the temperature characteristics without degradation of the linearity of the current-versus-light-output characteristics.

Moreover, the tapered stripe shape of the present embodiment reduces occurrence of SHB not only in the resonator direction but also in the horizontal direction, and therefore the carrier concentration in the inner region of the active layer where light exists further becomes uniform.

In the typical straight stripe structure, a carrier concentration in an active layer is relatively higher on a rear end side than on a front end side. Thus, during high-power operation with an output of equal to or greater than one watt, growth of lattice defects in the high-carrier-concentration region of the active layer occurs, resulting in lowering of the long-term reliability of the semiconductor light-emitting element.

On the other hand, according to the tapered stripe structure of the present embodiment, in high-power operation with an output of equal to or greater than one watt, an operating current value is low, and self-heating of the semiconductor light-emitting element is reduced. Further, there is another advantage that the carrier concentration not only in the resonator direction but also in the horizontal direction is maintained constant. Thus, even with a short resonator length of equal to or longer than 800 µm and equal to or shorter than 1300 µm, growth of lattice defects in the active layer is reduced, and long-term reliability is improved.

Fifth Embodiment

The second and fourth embodiments are intended for the structure where the width of the p-type GaN contact layer (317, 417) is smaller than that of the top part of the ridge formed at the p-type AlGaN cladding layer (316, 416). These embodiments have been set forth as example embodiments in which the width of a current injection region of the ridge top part into which current is injected is set smaller than that of the ridge top part. Thus, the width of the current injection region may be set smaller than the width of the ridge top part in other structures.

Fifth Embodiment

Figure 29A:
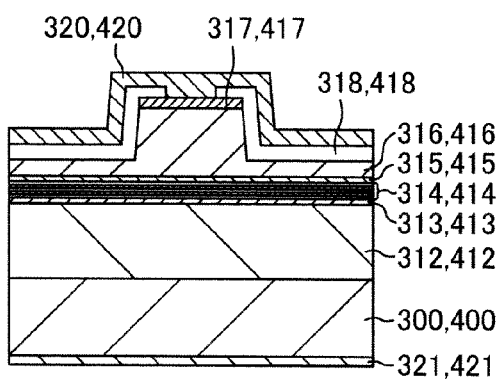
FIG. 29A is a cross-sectional view of a semiconductor light-emitting element of a fifth embodiment of the present disclosure.

In a fifth embodiment illustrated in FIG. 29A, the width of an opening of a current block layer (318, 418) is, at least at a front end, smaller than that of a ridge top part. This provides the structure where the width of a current injection region of the ridge top part into which current is injected from a p-type electrode (320, 420) is smaller than that of the ridge top part. Thus, the advantages similar to those of the foregoing embodiments can be provided.

Sixth Embodiment

Figure 29B:
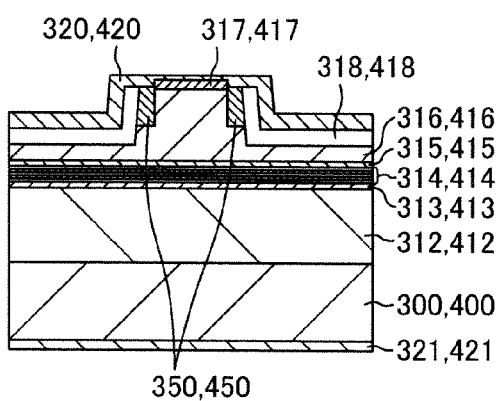
FIG. 29B is a cross-sectional view of a semiconductor light-emitting element of a sixth embodiment of the present disclosure.

In a sixth embodiment illustrated in FIG. 29B, the width of a p-type GaN contact layer (317, 417) is smaller than that of a top part of a ridge formed at a p-type AlGaN cladding layer (316, 416), and resistance is, at least at a front end, increased by implantation of ion into both end parts of the ridge-shaped stripe in the horizontal direction.

In the present embodiment, resistance is increased by implantation of ion into outer regions of the p-type GaN contact layer (317, 417). With higher resistance in such regions 350, 450, current spread in the horizontal direction inside the ridge can be reduced, and a small $\Delta W$ can reduce occurrence of SHB. In this case, an increase in series resistance of a semiconductor light-emitting element due to a decrease in width of the current injection region is reduced, and an increase in operating voltage is reduced. As a result, even in high-temperature operation, higher-level thermal saturation can be provided.

Seventh Embodiment

Figure 29C:
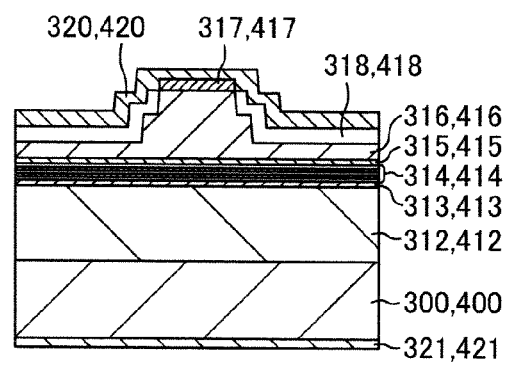
FIG. 29C is a cross-sectional view of a semiconductor light-emitting element of a seventh embodiment of the present disclosure.

In a seventh embodiment illustrated in FIG. 29C, a ridge-shaped stripe is in a raised shape in such a manner that part of the ridge positioned outside a p-type GaN contact layer (317, 417) is, at least at a front end, removed by etching. That is, the ridge-shaped stripe is in such a shape that an upper part is stacked on a lower part having a width relatively larger than that of the upper part and that a step is formed at the boundary between the upper and lower parts (side faces of the upper and lower parts may be inclined). According to such a structure, current spread in the horizontal direction inside the ridge can be reduced, and a small $\Delta W$ can reduce occurrence of SHB. In this case, an increase in series resistance of a semiconductor light-emitting element due to a decrease in width of a current injection region is reduced, and an increase in operating voltage is reduced. As a result, even in high-temperature operation, higher-level thermal saturation can be provided.

Eighth Embodiment

Figure 29D:
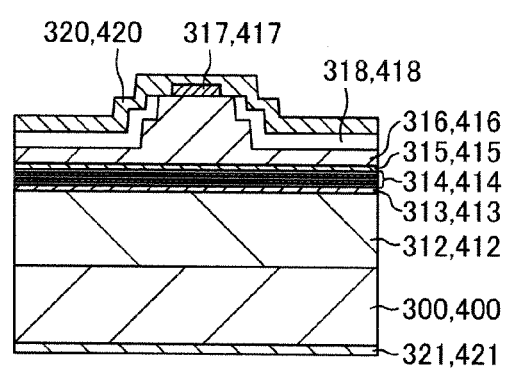
FIG. 29D is a cross-sectional view of a semiconductor light-emitting element of an eighth embodiment of the present disclosure.

In an eighth embodiment illustrated in FIG. 29D, the width of a p-type GaN contact layer (317, 417) is smaller than that of a top part of a ridge, and an outer part of the ridge is removed by etching. According to such a structure, it is further ensured that current spread in the horizontal direction inside the ridge is reduced and that occurrence of SHB is reduced. As a result, even in high-temperature operation, higher-level thermal saturation can be provided.

Ninth Embodiment

The magnitude of $\Delta W$ is not necessarily maintained constant in a resonator direction as described in the second and fourth embodiments (i.e., as illustrated in FIGS. 11 and 24). As long as Wf>We is satisfied at least at a front end, the magnitude of $\Delta W$ may change in the resonator direction, or $\Delta W=0$ may be satisfied at part of a resonator.

The same applies not only to the case where the width of a current injection region is limited by the width of a p-type GaN contact layer, but also to the structures described in the fifth and eight embodiments. That is, as long as the width of the current injection region is smaller than Wf at least at the front end, the difference $\Delta W$ between the width of the current injection region and Wf may change in the resonator direction, or $\Delta W=0$ may be satisfied at part of the resonator.

Figure 30A:
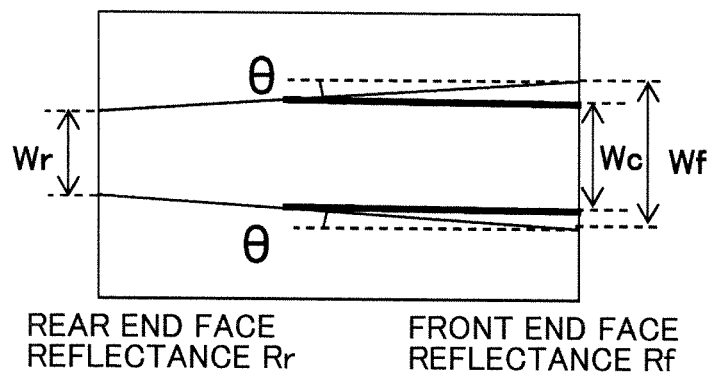
FIG. 30A is a view of a ridge-shaped stripe structure of a semiconductor light-emitting element of a ninth embodiment of the present disclosure.

Specific examples will be described below as ninth and tenth embodiments. In the ninth embodiment illustrated in FIG. 30A, the width of a current injection region is smaller than that of a top part of a ridge from the vicinity of a center part of a resonator to a front end of the resonator, and is the same as that of the ridge top part from a rear end of the resonator to the vicinity of the center part of the resonator. Moreover, $\Delta W$ increases toward the front end. In a tapered stripe structure where a low-reflectance coating and a high-reflectance coating are applied respectively to the front end and the rear end, SHB is more likely to occur on a front end side, i.e., on the side on which the stripe width is larger, than on a rear end side. For such a reason, $\Delta W$ on the front end side on which a light density is high may be increased as in the present embodiment, thereby reducing occurrence of SHB on the front end side in the tapered structure.

Tenth Embodiment

Figure 30B:
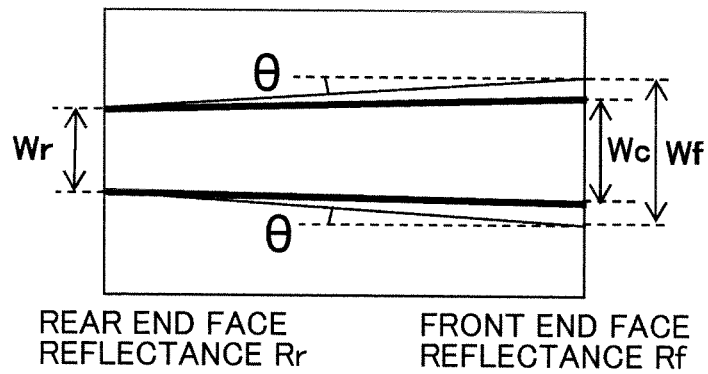
FIG. 30B is a view of a ridge-shaped stripe structure of a semiconductor light-emitting element of a tenth embodiment of the present disclosure.

In the tenth embodiment illustrated in FIG. 30B, the width of a current injection region is smaller than the width of a top part of a ridge from a rear end to a front end, and $\Delta W$ increases toward the front end. Thus, in the rear end region of the ridge-shaped stripe having a width relatively smaller than that of the front end region, an increase in series resistance of a semiconductor light-emitting element due to a further decrease in width of the current injection region can be reduced. As a result, an increase in operating voltage of the semiconductor light-emitting element can be reduced, and self-heating of the semiconductor light-emitting element can be reduced. Consequently, higher-level thermal saturation can be provided even in high-temperature operation at a temperature of equal to or higher than 60° C.

Eleventh Embodiment

In the foregoing embodiments, it has been only described that the center line of the ridge-shaped stripe of the waveguide is parallel to the normal direction of the resonator end face. However, the center line may be inclined.

Figure 31:
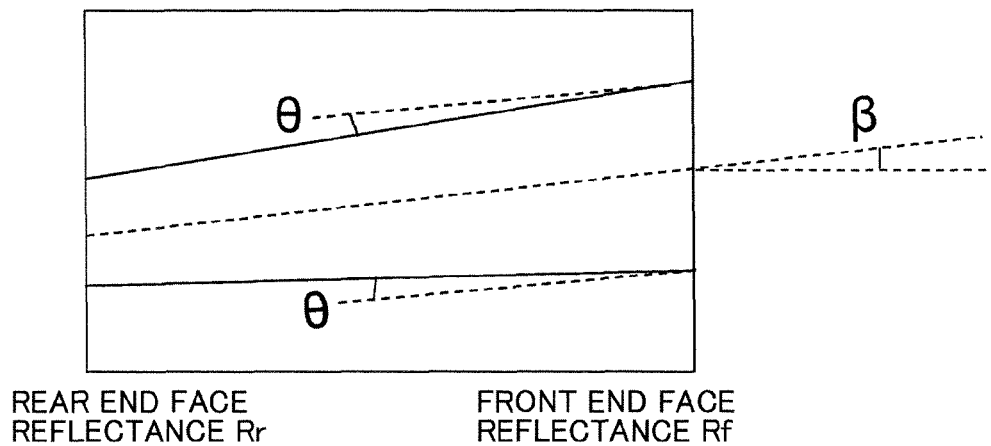
FIG. 31 is a view of a ridge-shaped stripe structure of a semiconductor light-emitting element of an eleventh embodiment of the present disclosure.
Figure 32:
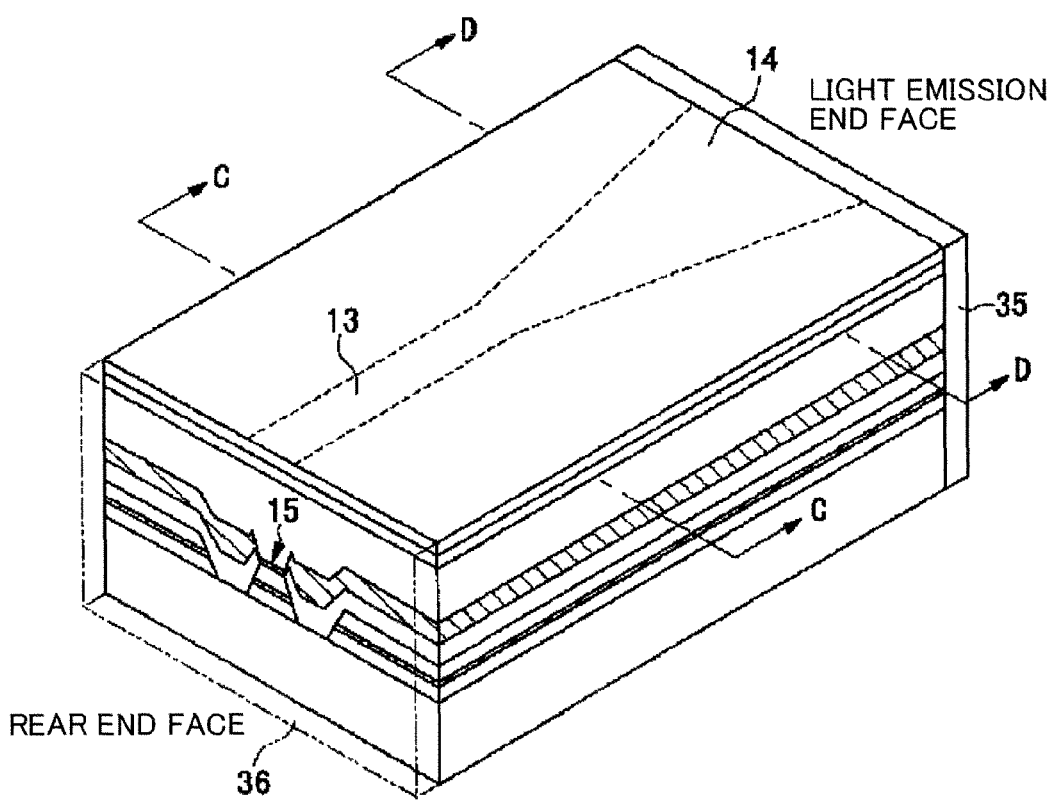
FIG. 32 is a view of a conventional semiconductor light-emitting element.

Specifically, as in an eleventh embodiment illustrated in FIG. 31, when the angle between the center line and the normal direction of a front end face is represented by "$\beta$," $\beta$ may be an angle of equal to or higher than 7°. In this case, the percentage of light which is reflected off the end face in a waveguide and then is coupled together and guided in the waveguide is reduced at an extremely-small value of equal to or less than $10^{-4}$. As a result, a super luminescent diode amplifying guided light can be provided without lasing. The super luminescent diode can output induced emission light without lasing. In this case, even if high-intensity induced emission light is output, such output light is not coherent. Thus, in the case where the super luminescent diode is used as a projector light source or an illumination light source, light having less speckle noise can be emitted.

Thus, a super luminescent diode capable of operating with an output of equal to or greater than one watt even at a high temperature of equal to or higher than 60° C. can be provided in such a manner that the angle $\beta$ between the center line and the front end face of the ridge-shaped stripe is set at an angle of equal to or higher than 7° in the waveguide structures described with reference to FIGS. 3, 11, 18, 24, and 30.

In the foregoing embodiments, as long as the tapered region is formed between the front and rear end faces, the regions where the stripe width is not changed may be formed in the vicinity of both end faces. Specifically, if the regions where the stripe width is not changed from 100 μm are formed in the vicinity of the front and rear end faces, the characteristic change in semiconductor light-emitting elements caused due to the change in cleavage position when cleavage and separation are performed to manufacture the semiconductor light-emitting elements can be reduced.

According to the semiconductor light-emitting element of the present disclosure, a watt-class light source capable of performing ultra-high-power operation even at high temperature and having excellent temperature characteristics can be provided, and is applicable to, e.g., a projector light source.

What is claimed is:

1. A semiconductor light-emitting element comprising: a first cladding layer in a first conductive type; a quantum well active layer; and a second cladding layer in a second conductive type, wherein: the first cladding layer, the quantum well active layer and the second cladding layer which are stacked on a semiconductor substrate in this order, a ridge-shaped stripe formed at the second cladding layer forms a waveguide, Rf<Rr and Wf>Wr are satisfied, where a width of the ridge-shaped stripe at a front end face from which laser light is output is represented by Wf, a width of the ridge-shaped stripe at a rear end face opposite to the front end face is represented by Wr, a reflectance of the front end face is represented by Rf, and a reflectance of the rear end face is represented by Rr, a width W of a current injection region at the front end face is less than the width Wf of the ridge-shaped stripe at the front end face, and when (i) an average width Wave of the ridge-shaped stripe is within a range longer than 6 μm and equal to or shorter than 12 μm, (ii) a resonator length is within a range of equal to or longer than 550 μm and equal to or shorter than 1000 μm, and (iii) ΔW is calculated by (Wf−W), ΔW is set at equal to or greater than ((Wave/3−1)−1) μm and equal to or less than ((Wave/3−1)+1) μm.

2. The semiconductor light-emitting element of claim 1, further comprising:
a contact layer formed on the second cladding layer, wherein a width Wc of the contact layer at the front end face is less than the width Wf of the ridge-shaped stripe at the front end face.

3. The semiconductor light-emitting element of claim 1, further comprising:
a current block layer formed on the second cladding layer such that an opening is formed,
wherein a width of the opening of the current block layer at the front end face is less than the width Wf of the ridge-shaped stripe at the front end face.

4. The semiconductor light-emitting element of claim 1, wherein:
the ridge shaped stripe includes a first region having a first width and a second region having a second width disposed on the first region, and
the first width is greater than the second width.

5. The semiconductor light-emitting element of claim 1, wherein:
resistance of both side portions of the ridge-shaped stripe in a width direction perpendicular to an extending direction of the ridge-shaped stripe is higher than resistance of a middle portion of the ridge-shaped stripe between the both side portions in the width direction, and the both side portions include side surfaces of the ridge-shaped stripe, respectively.

6. The semiconductor light-emitting element of claim 1, wherein
an angle θ satisfies $\tan(\theta)=\Delta W_1/(2L)$, where a length of a region of the waveguide in which a ridge-shaped stripe width changes in a resonator direction is represented by L and an absolute value of a difference between the ridge-shaped stripe width at a width change start point and the ridge-shaped stripe width at a width change end point is represented by $\Delta W_1$, and
the angle θ falls within a range of equal to or higher than 0.05° and equal to or lower than 0.15°.

7. The semiconductor light-emitting element of claim 1, wherein:
the quantum well active layer is a multiple quantum well active layer,
the width Wf of the ridge-shaped stripe at the front end face falls within a range of equal to or greater than 6 μm and equal to or less than 12 μm, and
a total thickness of well layers of the multiple quantum well active layer falls within a range of equal to or greater than 9 nm and equal to or less than 20 nm.

8. The semiconductor light-emitting element of claim 7, wherein
0≤xw≤0.1 is satisfied, where an atomic composition of each well layer of the multiple quantum well active layer is $In_{xw}Ga_{yw}Al_{1-xw-yw}N$, and
a thickness of each well layer of the multiple quantum well active layer falls within a range of equal to or greater than 3 nm and equal to or less than 8 nm.

9. The semiconductor light-emitting element of claim 2, wherein
the width Wc of the contact layer at the front end face is equal to the width W of the current injection region at the front end face.

10. The semiconductor light-emitting element of claim 1, wherein
the semiconductor light-emitting element outputs a laser light having a wavelength of 405 nm band.

11. A semiconductor light-emitting element comprising:
a first cladding layer in a first conductive type;
a quantum well active layer; and
a second cladding layer in a second conductive type, wherein:
the first cladding layer, the quantum well active layer and the second cladding layer are stacked on a semiconductor substrate in this order,
a ridge-shaped stripe formed at the second cladding layer forms a waveguide,
Rf<Rr and Wf>Wr are satisfied, where a width of the ridge-shaped stripe at a front end face from which laser light is output is represented by Wf, a width of the ridge-shaped stripe at a rear end face opposite to the front end face is represented by Wr, a reflectance of the front end face is represented by Rf, and a reflectance of the rear end face is represented by Rr,
a width W of a current injection region at the front end face is less than the width Wf of the ridge-shaped stripe at the front end face,
when (i) an average width $W_{ave}$ of the ridge-shaped stripe is within a range of equal to or longer than 10 μm and equal to or shorter than 30 μm, (ii) a resonator length is within a range of equal to or longer than 800 μm and equal to or shorter than 1300 μm, and (iii) ΔW is calculated by (Wf−W), ΔW is set at equal to or greater than 1 μm and equal to or less than $((W_{ave}/4+0.33)+2)$ μm.

12. The semiconductor light-emitting element of claim 11, further comprising:
   a contact layer formed on the second cladding layer,
   wherein a width Wc of the contact layer at the front end face is less than the width Wf of the ridge-shaped stripe at the front end face.

13. The semiconductor light-emitting element of claim 11, further comprising:
   a current block layer formed on the second cladding layer such that an opening is formed,
   wherein a width of the opening of the current block layer at the front end face is less than the width Wf of the ridge-shaped stripe at the front end face.

14. The semiconductor light-emitting element of claim 11, wherein:
   the ridge shaped stripe includes a first region having a first width and a second region having a second width disposed on the first region, and
   the first width is greater than the second width.

15. The semiconductor light-emitting element of claim 11, wherein:
   resistance of both side portions of the ridge-shaped stripe in a width direction perpendicular to an extending direction of the ridge-shaped stripe is higher than resistance of a middle portion of the ridge-shaped stripe between the both side portions in the width direction, and
   the both side portions include side surfaces of the ridge-shaped stripe, respectively.

16. The semiconductor light-emitting element of claim 11, wherein:
   an angle $\theta$ satisfies $\tan(\theta)=\Delta W_1/(2L)$, where a length of a region of the waveguide in which a ridge-shaped stripe width changes in a resonator direction is represented by L and an absolute value of a difference between the ridge-shaped stripe width at a width change start point and the ridge-shaped stripe width at a width change end point is represented by $\Delta W_1$, and
   the angle $\theta$ falls within a range of equal to or higher than 0.05° and equal to or lower than 0.15°.

17. The semiconductor light-emitting element of claim 11, wherein:
   the quantum well active layer is a multiple quantum well active layer,
   the width Wf of the ridge-shaped stripe at the front end face falls within a range of equal to or greater than 10 μm and equal to or less than 30 μm, and
   a total thickness of well layers of the multiple quantum well active layer falls within a range of equal to or greater than 4 nm and equal to or less than 10 nm.

18. The semiconductor light-emitting element of claim 17, wherein:
   $0.1 \leq xw \leq 0.15$ is satisfied, where an atomic composition of each well layer of the multiple quantum well active layer is $In_{xw}Ga_{yw}Al_{1-xw-yw}N$, and
   a thickness of each well layer of the multiple quantum well active layer falls within a range of equal to or greater than 2 nm and equal to or less than 5 nm.

19. The semiconductor light-emitting element of claim 11, wherein
   $\Delta W$ is set at equal to or greater than 2 μm and equal to or less than $((W_{ave}/4+0.33)+1)$ μm.

20. The semiconductor light-emitting element of claim 12, wherein
   the width Wc of the contact layer at the front end face is equal to the width W of the current injection region at the front end face.

21. The semiconductor light-emitting element of claim 11, wherein
   the semiconductor light-emitting element outputs a laser light having a wavelength of 445 nm band.

* * * * *